United States Patent
Huang et al.

(10) Patent No.: US 10,043,050 B2
(45) Date of Patent: Aug. 7, 2018

(54) IMAGE SENSING WITH A DISPLAY

(71) Applicant: Microsoft Technology Licensing, LLC, Redmond, WA (US)

(72) Inventors: Jiandong Huang, Bellevue, WA (US); Timothy Andrew Large, Bellevue, WA (US); Liying Chen, Redmond, WA (US); Steven Nabil Bathiche, Bellevue, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 15/221,418

(22) Filed: Jul. 27, 2016

(65) Prior Publication Data
US 2017/0255811 A1 Sep. 7, 2017

Related U.S. Application Data
(60) Provisional application No. 62/304,853, filed on Mar. 7, 2016.

(51) Int. Cl.
*G06K 9/00* (2006.01)
*G06T 11/60* (2006.01)
(Continued)

(52) U.S. Cl.
CPC ........... *G06K 9/0004* (2013.01); *G06F 3/042* (2013.01); *G06F 3/044* (2013.01); *G06F 3/045* (2013.01);
(Continued)

(58) Field of Classification Search
CPC ... G06T 11/60; G06K 9/0008; G06K 9/00013
See application file for complete search history.

(56) References Cited

U.S. PATENT DOCUMENTS
4,728,186 A 3/1988 Eguchi et al.
5,319,182 A * 6/1994 Havens ............. G06K 7/10722
235/440
(Continued)

FOREIGN PATENT DOCUMENTS
EP 0609812 A1 8/1994
EP 942583 A1 9/1999
(Continued)

OTHER PUBLICATIONS
"A Fingerprint Scanner That Can Capture Prints From 20 Feet Away: Opening doors with the save of a hand", published on Jun. 25, 2012, available at: http://www.popsci.com/technology/article/2012-06/fingerprint-scanner-captures-prints-20-feet-away.
(Continued)

*Primary Examiner* — Mia M Thomas
(74) *Attorney, Agent, or Firm* — Holzer Patel Drennan

(57) ABSTRACT

An electronic device includes a cover glass having a display surface, a pixelated photoemitting element array, and a pixelated photodetecting element array. The pixelated photoemitting element array emits a light signal through the cover glass to the display surface. The pixelated photodetecting element array is positioned relative to the pixelated photoemitting element array and the cover glass to receive a reflected light signal. The reflected light signal includes a portion of the emitted light signal reflected by total internal reflection from a refractive boundary at the display surface. Operation of each pixel is switched between the one or more photodetecting elements and the one or more photoemitting elements by the pixel selector signal component received from the pixel selector signal bus. A sensing trigger is configured to trigger the imaging scan by the pixelated photoemitting element array and the pixelated photodetecting element array, responsive to detection of an initiating action.

22 Claims, 14 Drawing Sheets

(51) Int. Cl.

| | | |
|---|---|---|
| *G06F 3/041* | (2006.01) | |
| *G06F 3/042* | (2006.01) | |
| *G06F 3/044* | (2006.01) | |
| *G06F 3/045* | (2006.01) | |
| *G06K 9/20* | (2006.01) | |
| *H04N 5/225* | (2006.01) | |
| *H04N 5/369* | (2011.01) | |
| *H01L 27/146* | (2006.01) | |
| *H01L 27/32* | (2006.01) | |

(52) U.S. Cl.
CPC .......... *G06F 3/0414* (2013.01); *G06F 3/0421* (2013.01); *G06K 9/0008* (2013.01); *G06K 9/00013* (2013.01); *G06K 9/00026* (2013.01); *G06K 9/209* (2013.01); *G06K 9/2027* (2013.01); *G06K 9/2081* (2013.01); *G06T 11/60* (2013.01); *H01L 27/14609* (2013.01); *H01L 27/3234* (2013.01); *H04N 5/2253* (2013.01); *H04N 5/2254* (2013.01); *H04N 5/3698* (2013.01); *H01L 27/323* (2013.01)

(56) References Cited

U.S. PATENT DOCUMENTS

| | | | |
|---|---|---|---|
| 5,808,729 A | 9/1998 | Sugawara | |
| 5,929,845 A | 7/1999 | Wei et al. | |
| 6,057,639 A * | 5/2000 | May | H04N 13/0406 313/371 |
| 6,538,644 B1 * | 3/2003 | Muraoka | G06F 3/0421 345/156 |
| 6,885,439 B2 | 4/2005 | Fujieda | |
| 7,315,014 B2 * | 1/2008 | Lee | H01L 27/1463 250/208.1 |
| 7,366,331 B2 | 4/2008 | Higuchi | |
| 7,589,313 B2 * | 9/2009 | Nordenfelt | G01D 5/34707 250/231.13 |
| 7,728,959 B2 | 6/2010 | Waldman et al. | |
| 7,745,900 B2 * | 6/2010 | Li | G02B 1/11 257/437 |
| 7,834,988 B2 | 11/2010 | Bahuguna | |
| 8,204,284 B2 * | 6/2012 | Wu | G06K 9/00046 382/100 |
| 8,276,816 B2 | 10/2012 | Gardner | |
| 9,589,995 B2 * | 3/2017 | Shi | H01L 27/1225 |
| 9,595,546 B2 * | 3/2017 | Kim | H01L 27/1251 |
| 9,638,844 B2 * | 5/2017 | Girard Desprolet | G02B 5/201 |
| 9,658,372 B2 * | 5/2017 | Frey | G01J 1/0437 |
| 9,691,834 B2 * | 6/2017 | Wang | H01L 27/3265 |
| 9,711,578 B2 * | 7/2017 | Cho | H01L 27/3258 |
| 9,768,240 B2 * | 9/2017 | Lee | H01L 27/3265 |
| 2002/0118865 A1 | 8/2002 | Hosokawa | |
| 2003/0118219 A1 | 6/2003 | Higuchi et al. | |
| 2004/0120684 A1 * | 6/2004 | Ishibashi | C09K 11/7734 385/141 |
| 2004/0196253 A1 * | 10/2004 | Eichenlaub | G02B 3/005 345/102 |
| 2004/0252867 A1 | 12/2004 | Lan et al. | |
| 2004/0263069 A1 * | 12/2004 | Yamazaki | G09G 3/30 313/506 |
| 2005/0063571 A1 | 3/2005 | Setlak et al. | |
| 2005/0133762 A1 * | 6/2005 | Lee | C09K 19/322 252/299.62 |
| 2005/0199857 A1 * | 9/2005 | Lee | C09K 19/12 252/299.63 |
| 2007/0206248 A1 | 9/2007 | Winterbottom et al. | |
| 2007/0252005 A1 | 11/2007 | Konicek | |
| 2008/0073424 A1 | 3/2008 | Ni | |
| 2008/0121442 A1 | 5/2008 | Boer et al. | |
| 2008/0150848 A1 * | 6/2008 | Chung | G06F 3/0412 345/82 |
| 2009/0039241 A1 | 2/2009 | Ueki | |
| 2009/0153926 A1 | 6/2009 | Wiltshire et al. | |
| 2010/0066800 A1 * | 3/2010 | Ryf | H04N 7/144 348/14.01 |
| 2010/0097348 A1 * | 4/2010 | Park | G06F 3/0421 345/175 |
| 2010/0156848 A1 * | 6/2010 | Yatsuda | B29D 11/00663 345/175 |
| 2011/0057866 A1 | 3/2011 | Konicek | |
| 2011/0122091 A1 * | 5/2011 | King | G06F 3/0421 345/175 |
| 2012/0188171 A1 * | 7/2012 | Alameh | H03K 17/9638 345/173 |
| 2012/0311719 A1 | 12/2012 | Hamann et al. | |
| 2013/0032914 A1 * | 2/2013 | Iwasaki | H01L 27/14621 257/432 |
| 2013/0038719 A1 * | 2/2013 | Canini | G06K 7/10732 348/135 |
| 2013/0127790 A1 * | 5/2013 | Wassvik | G06F 3/042 345/175 |
| 2013/0127980 A1 | 5/2013 | Haddick et al. | |
| 2013/0287272 A1 | 10/2013 | Lu et al. | |
| 2013/0314368 A1 * | 11/2013 | Li | G06F 3/0421 345/174 |
| 2014/0003683 A1 | 1/2014 | Vieta et al. | |
| 2014/0063049 A1 * | 3/2014 | Armstrong-Muntner | G03B 9/00 345/619 |
| 2014/0133715 A1 | 5/2014 | Ballard et al. | |
| 2014/0225838 A1 | 8/2014 | Gupta et al. | |
| 2014/0226879 A1 * | 8/2014 | Westerman | G06K 9/00013 382/125 |
| 2014/0355846 A1 | 12/2014 | Lee et al. | |
| 2015/0016695 A1 | 1/2015 | Yoon | |
| 2015/0036065 A1 | 2/2015 | Yousefpor et al. | |
| 2015/0091875 A1 * | 4/2015 | Li | G06F 3/0421 345/176 |
| 2015/0135108 A1 | 5/2015 | Pope et al. | |
| 2015/0139511 A1 * | 5/2015 | Yoon | G06K 9/00919 382/124 |
| 2015/0181059 A1 | 6/2015 | Hu | |
| 2015/0243722 A1 * | 8/2015 | Kwon | H01L 27/3262 257/40 |
| 2015/0286306 A1 | 10/2015 | Abrams et al. | |
| 2015/0348504 A1 * | 12/2015 | Sakariya | G09G 3/3233 345/206 |
| 2015/0364107 A1 | 12/2015 | Sakariya et al. | |
| 2016/0078270 A1 * | 3/2016 | Lee | G06K 9/0008 382/125 |
| 2016/0092718 A1 * | 3/2016 | Jensen | G06K 9/0004 382/124 |
| 2016/0140902 A1 * | 5/2016 | Yang | G09G 3/3258 345/78 |
| 2016/0266279 A1 * | 9/2016 | Aurongzeb | G02B 1/111 |
| 2016/0342282 A1 * | 11/2016 | Wassvik | G02F 1/13338 |
| 2017/0024083 A1 * | 1/2017 | Gilton | G06F 3/0421 |
| 2017/0079591 A1 * | 3/2017 | Gruhlke | A61B 5/6898 |
| 2017/0255809 A1 * | 9/2017 | Huang | G06F 3/0414 |

FOREIGN PATENT DOCUMENTS

| | | |
|---|---|---|
| EP | 1271389 A2 | 1/2003 |
| EP | 2328178 A2 | 6/2011 |
| KR | 20050000455 A | 1/2005 |
| WO | 02065752 A1 | 8/2002 |
| WO | 2011110821 A1 | 9/2011 |

OTHER PUBLICATIONS

Pratap, Ketan, "Samsung Galaxy S5 said to come with fingerprint sensor, hovering touch feature", Published on: Jan. 21, 2014, Available at: http://gadgets.ndtv.com/mobiles/news/samsung-galaxy-s5-said-to-come-with-fingerprint-sensor-hovering-touch-feature-473581.

Ifeanyi, et al., "A Dual System Capture Biometric Fingerprint Scanner", In International Journal of Engineering and Computer Science, vol. 4, Issue 12, Dec. 2015, pp. 15213-15219.

(56) References Cited

OTHER PUBLICATIONS

Tweedie, Steven, "Apple files for a patent to move its fingerprint scanner from the home button to underneath the touchscreen", Published on: Feb. 9, 2015, Available at: http://www.businessinsider.in/Apple-files-for-a-patent-to-move-its-fingerprint-scanner-from-the-home-button-to-underneath-the-touchscreen/articleshow/46179357.cms.
"RVH Technology: Specialist Photopolymer HOE R&D Company", Published on: Mar. 2015, Available at: https://www.reconnaissance.net/holography-news/issues/march-2015/.
Whitwam, Ryan, "Qualcomm's new fingerprint sensor uses ultrasonic waves, could be built into screens", Published on: Jan. 7, 2016, Available at: http://www.extremetech.com/mobile/220598-qualcomms-new-fingerprint-sensor-uses-ultrasonic-waves-could-be-built-into-screens.
"Fingerprint Cards launches touch fingerprint sensor under cover glass", Published on: Feb. 18, 2016, Available at: http://www.fingerprints.com/blog/2016/02/18/fingerprint-cards-launches-touch-fingerprint-sensor-under-cover-glass/.
Huang, et al., U.S. Appl. No. 15/221,472, "Pixel Having a Photoemitter and a Photodetector Triggered by a Pixel Selector Signal Bus", Filed Date: Jul. 27, 2016.
Huang, et al., U.S. Appl. No. 15/221,494, "Triggered Image Sensing With a Display", Filed Date: Jul. 27, 2016.
Chen, et al., U.S. Appl. No. 15/282,434, "Image Sensing With a Waveguide Display", Filed Date: Oct. 30, 2016.
"JENETRIC sensor combines user display, fingerprint area", Published on: Sep. 24, 2015, Available at: http://www.planetbiometrics.com/article-details/i/3553/.
Kwon, et al., "A Three-Terminal n+-p-n+ Silicon CMOS Light-Emitting Device for the New Fully Integrated Optical-Type Fingerprint Recognition System", In Journal of Display Technology, vol. 12, Issue 1, Jan. 2016, pp. 77-81.
U.S. Appl. No. 14/628293, Huang, et al., "Fingerprint Detection with Transparent Cover", Filed Date: Feb. 22, 2015.
"International Search Report & Written Opinion Issued in PCT Application No. PCT/US2016/016250", dated Apr. 22, 2016, 10 Pages.
Davide Maltoni, "Fingerprint Recognition—Sensing, Feature Extraction and Matching", Summer School for Advanced Studies on Biometrics: Autentication and Recognition, Jun. 2-6, 2003, 17 pages.
Holz et al., "Fiberio: A Touchscreen that Senses Fingerprints", Proceedings of the 26th Annual ACM Symposium on User Interface and Technology, Oct. 8, 2013, 10 pages.
Jean-Francois Mainguet, "Fingerprint Sensing Techniques", Jul. 29, 2010, available at: http://fingerchip.pagesperso-orange.fr/biometrics/types/fingerprint_sensors_physics_htm#electro-optical.
Shikai et al., "Fingerprint Sensor Using Fiber Optic Faceplate", Proceedings of SPIE 2932, Human Detection and Positive Identification: Methods and Technologies, Jan. 28, 1997, 2 pages.
Xia et al., "Innovations in Fingerprint Capture Devices", Proceedings of Pattern Recognition, Feb. 2003, 9 pages, vol. 36, Issue 2.
International Searching Authority, U.S. Patent and Trademark Office, Second Written Opinion of the International Preliminary Examining Authority for PCT/US2016/016250 dated Jul. 6, 2016, 5 pages.
Sansosti, Tanya M., "LED's as Detectors", In Stony Brook University, Laser Teaching Center, Optics Rotation Project 2, Jan. 1, 2002, 8 Pages.
Baddi, Raju, "Use LEDs as Photodiodes | EDN", Retrieved from <<http://www.edn.com/design/led/4363842/Use-LEDs-as-photodiodes >>, Nov. 18, 2010, 6 Pages.
Rutz, Alexander, "LED-Is using a Display Panel as a Light Sensor Conceivable?—Electrical Engineering Stack Exchange", Retrieved from <<https://electronics.stackexchange.com/questions/138348/is-using-a-display-panel-as-a-light-sensor-conceivable>>, Nov. 13, 2014, 2 Pages.
"International Search Report and Written Opinion Issued in PCT Application No. PCT/US2017/019803", dated Jun. 1, 2017, 12 Pages.
"International Search Report & Written Opinion Issued in PCT Application No. PCT/US2017/019802", dated Jun. 2, 2017, 13 Pages.
International Search Report and Written Opinion Issued in PCT Application No. PCT/US2017/019812, dated Jul. 13, 2017, 14 Pages.

\* cited by examiner

IMAGE SENSING WITH A DISPLAY

CROSS-REFERENCE TO RELATED APPLICATIONS

The present application claims benefit of priority to U.S. Provisional Patent Application No. 62/304,853, entitled "High-Resolution Imaging and Sensing with Display" and filed on Mar. 7, 2016, which is specifically incorporated by reference for all that it discloses and teaches.

The present application is also related to U.S. patent application Ser. No. 15/221,472 filed Jul. 27, 2016, entitled "Pixel having a Photoemitter and a Photodetector Triggered by a Pixel Selector Signal Bus," and U.S. patent application Ser. No. 15/221,494 filed Jul. 27, 2016, entitled "Triggered Image Sensing with a Display," both of which are filed concurrently herewith and are specifically incorporated by reference for all that they disclose and teach.

BACKGROUND

Fingerprint detection systems for use with computing devices may employ a variety of technologies, including capacitive sensing, ultrasound sensing, lensed digital cameras, etc. However, such solutions come with significant limitations. For example, bezel-less or very small bezel devices do not leave sufficient area for fingerprint detection components outside of the display area. Furthermore, capacitive sensing is very sensitive to the distance between the finger and the sensor, such that the cover glass of a display of a computing device may dramatically reduce the effectiveness of the capacitive sensing resolution if the capacitive sensing components are positioned beneath the display. Ultrasonic sensing is accompanied by noise issues and manufacturing issues (including detrimental mechanical impedance between the sensor and the display surface). Lensed digital cameras tend to be bulky and expensive. Many such solutions also tend to be difficult to scale in area across the area of the computing device front face or display.

SUMMARY

The described technology provides an electronic device including a cover glass having a display surface, a pixelated photoemitting element array, and a pixelated photodetecting element array. The pixelated photoemitting element array has one or more selected photoemitting elements of the pixelated photoemitting element array configured to emit a light signal through the cover glass to the display surface. The pixelated photodetecting element array is positioned relative to the pixelated photoemitting element array and the cover glass to receive a reflected light signal at individual photodetecting elements of the pixelated photodetecting element array. The reflected light signal includes a portion of the emitted light signal reflected by total internal reflection from a refractive boundary at the display surface of the cover glass. Image processing circuitry is electrically coupled to the pixelated photoemitting element array and the pixelated photoemitting element array and is configured to stitch the reflected light signal received by each photodetecting element of the pixelated photodetecting element array into a composite image of an object in contact with the display surface of the display.

In another implementation, an electronic device includes a cover glass of a display having a display surface, a pixel selector signal bus configured to communicate a pixel selection signal component; and a pixel array of the display. The pixel array is electrically connected to the pixel selector signal bus and includes multiple pixels configured to sense an image of an object in contact with a surface of the display. Each pixel in the pixel array includes one or more photodetecting elements and one or more photoemitting elements. Operation of each pixel is switched between the one or more photodetecting elements and the one or more photoemitting elements by sensor control instructions in the pixel selector signal component received from the pixel selector signal bus. Image processing circuitry is electrically coupled to the pixel array and is configured to scan light from multiple pixels of the pixel array. The image processing circuitry stitches a light signal reflected from a refractive boundary at the display surface and received by photodetecting elements of the pixelated photodetecting element array into a composite image of the object.

In another implementation, an electronic device includes a cover glass having a display surface, a pixelated photoemitting element array, and a pixelated photodetecting element array. One or more selected photoemitting elements of the pixelated photoemitting element array is configured to emit a light signal through the cover glass to the display surface as part of an imaging scan. The pixelated photodetecting element array is positioned relative to the pixelated photoemitting element array and the cover glass to receive a reflected light signal at individual photodetecting elements of the pixelated photodetecting element array as part of the imaging scan. A sensing trigger is configured to trigger the imaging scan by the pixelated photoemitting element array and the pixelated photodetecting element array, responsive to detection of an initiating action. Image processing circuitry is coupled to the sensing trigger, the pixelated photoemitting element array and the pixelated photodetecting element array. The sensing trigger transmits trigger data to image processing circuitry to initiate the imaging scan through the cover glass.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Other implementations are also described and recited herein.

DETAILED DESCRIPTIONS

Figure 1:
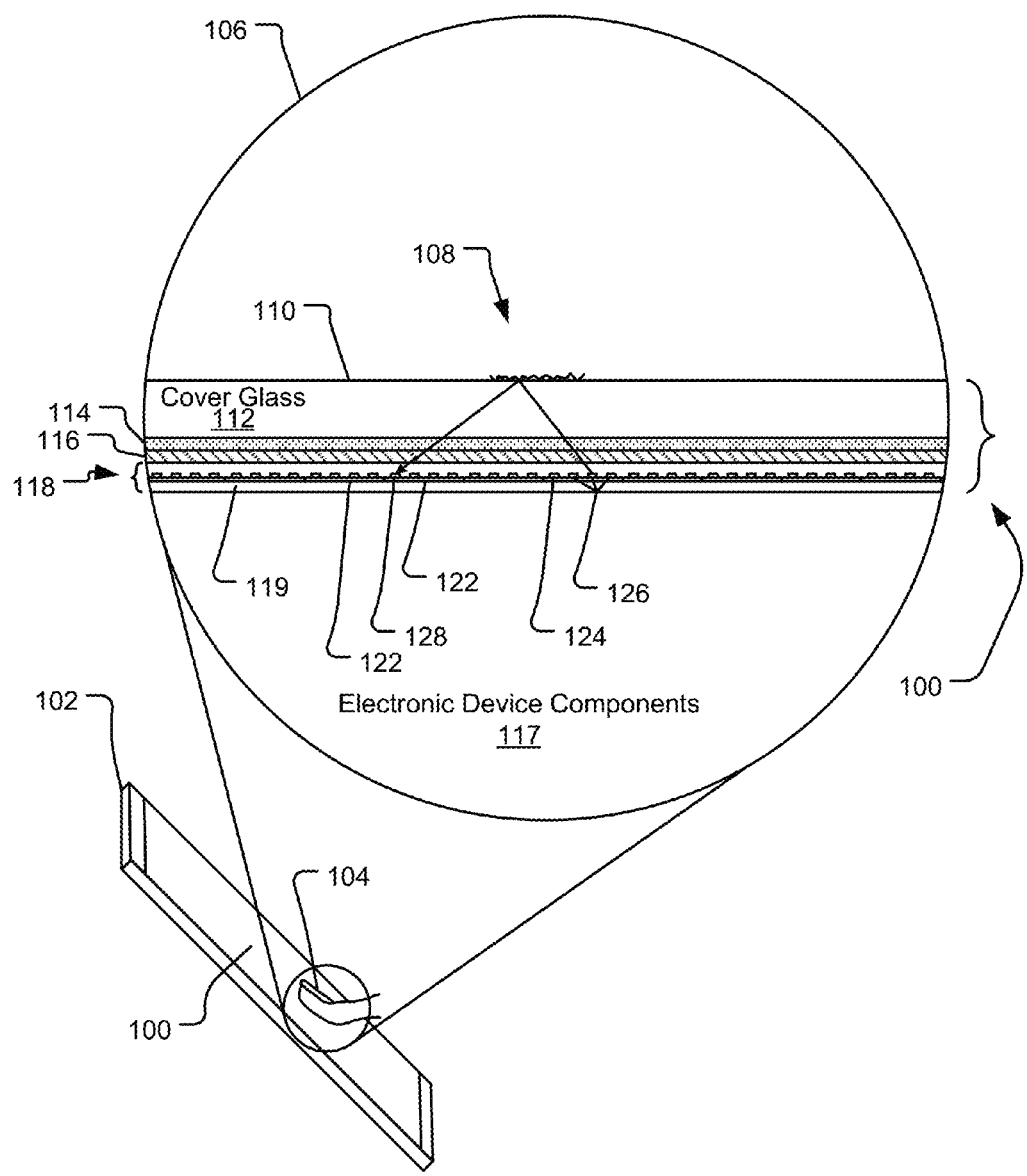
FIG. 1 illustrates an example image sensing display of an electronic device.

FIG. 1 illustrates an example image sensing display 100 of an electronic device 102. In FIG. 1, the example electronic device 102 is shown as a mobile phone, although other electronic devices may include without limitation tablet computers, electronic displays, laptop computers, all-in-one computers, electronic accessories, building security devices, automated teller machines, etc. A user's thumb 104 is shown pressed against a display surface 110 of the image sensing display 100. Fingerprint sensing in these and other environments is an example of imaging that can be provided by the described technology, although other types of imaging may be employed.

As shown in the blown-up drawing in circle 106, ridges 108 on the user's thumb 104 contact the display surface 110 of the image sensing display 100, which in at least one implementation includes a cover glass 112, a polarizing layer 114, one or more quarter wavelength plate(s) 116, and an photodetecting/emitting layer 118. In one implementation, the photodetecting/emitting layer 118 may include multiple sublayers and organic light-emitting diodes (OLEDs) positioned on a substrate 119. A OLED sublayer may include transparent or translucent regions, which can allow light to pass through sublayers of the photodetecting/emitting layer 118. In one implementation, as shown in FIG. 1, at least one photodetecting element and one or more separate photoemitting elements are included in a single pixel. In an alternative implementation, an individual OLED element may be selectively biased to operate as either a photodetecting element or a photoemitting element. Other electronic device components 117 are shown immediately below the image sensing display 100, although intervening layers may exist.

In one implementation, the photodetecting/emitting layer 118 includes an array of pixels, such as pixels 122, wherein each pixel includes at least one photoemitting element, such as photoemitting elements 126, and at least one photodetecting element, such as photodetecting elements 124. In the photodetecting/emitting layer 118, each pixel is shown as including three photoemitting elements (e.g., red, green, and blue elements) and a photodetecting element, although other configurations are contemplated. As shown, the photodetecting elements and photoemitting elements of each pixel are configured in substantially the same sublayer or plane. By configuring a single pixel to include photodetecting elements and photoemitting elements in the same sublayer, the image sensing display 100 can provide both photodetecting and photoemitting functionality without substantially increasing the thickness of the image sensing display 100.

In the example of FIG. 1, light emitted by one of the photoemitting elements 126 is transmitted to a refractive boundary at the display surface 110 of the image sensing display 100. Light having an angle of incidence greater than a critical angle is reflected by total internal reflection through the cover glass of the image sensing display 100. Where a feature of an object (e.g., a ridge of a finger print) is optically-coupled to the display surface 110, the reflected light scatters toward the photodetecting/emitting layer 118. Where no feature of the object is optically-coupled to the display surface 110, the reflected light reflects in a non-scattered manner toward the photodetecting/emitting layer 118. The non-scattered reflected light and the ridge-scattered reflected light are captured by a photodetecting element 128. As described in more detail below, the photoemitting elements 126 of array of pixels 122 can scan a region of the display surface 110 of the image sensing display 100 to illuminate an object on the display surface 110 and can capture light reflecting off the display surface 110 using the photodetecting elements 124 of the array of pixels 122. The captured light can then be stitched together to yield a composite image of the object.

Figure 2:
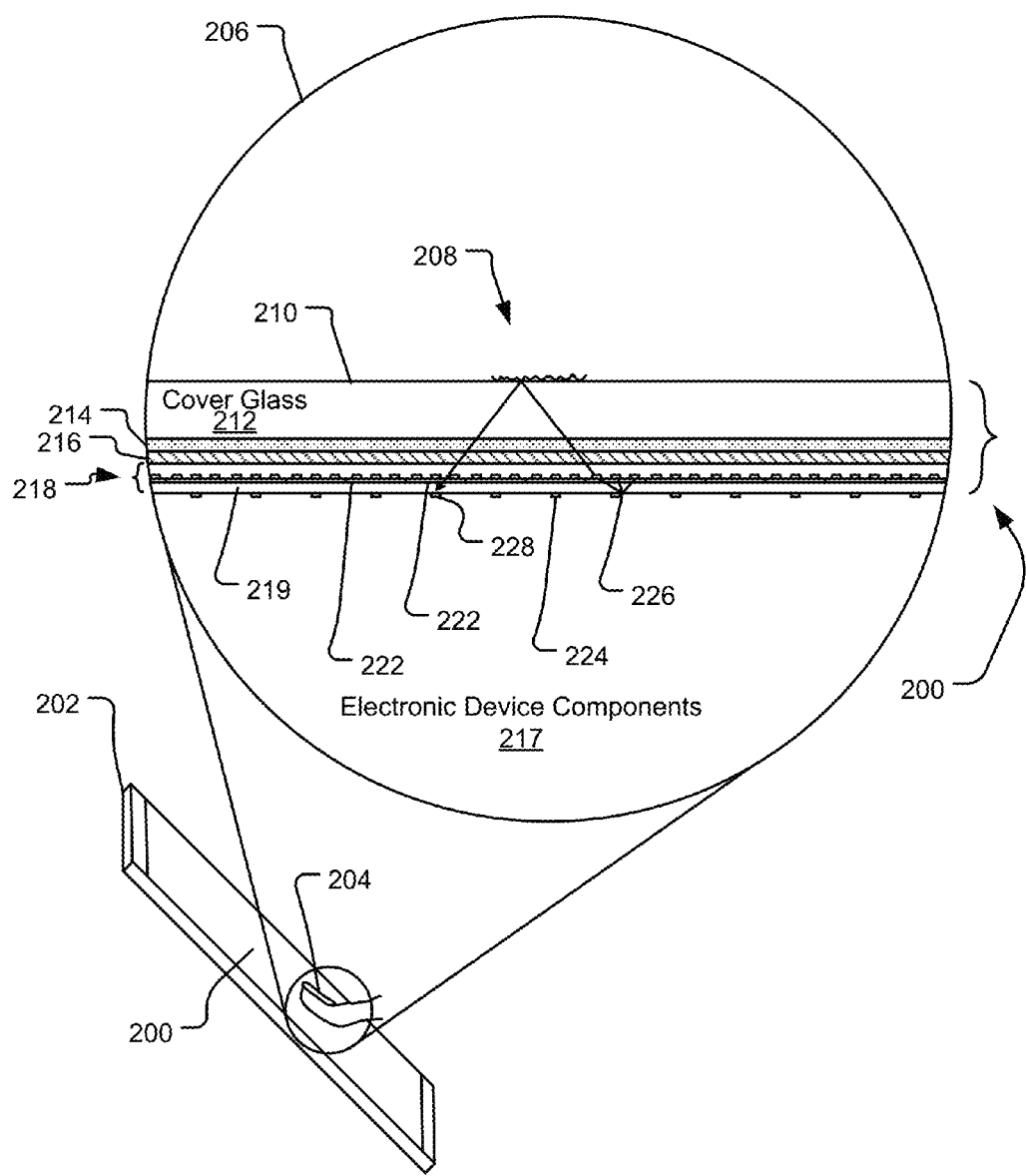
FIG. 2 illustrates another example image sensing display of an electronic device.

FIG. 2 illustrates another example image sensing display of an electronic device. In FIG. 2, the example electronic device 202 is shown as a mobile phone, although other electronic devices may include without limitation tablet computers, electronic displays, laptop computers, all-in-one computers, electronic accessories, building security devices, automated teller machines, etc. A user's thumb 204 is shown pressed against a display surface 210 of the image sensing display 200. Fingerprint sensing in these and other environments is an example of imaging that can be provided by the described technology, although other types of imaging may be employed.

As shown in the blown-up drawing in circle 206, ridges 208 on the user's thumb 204 contact the surface 210 of the image sensing display 200, which in at least one implementation includes a cover glass 212, a polarizing layer 214, one or more quarter wavelength plate(s) 216, and an photodetecting/emitting layer 218. In one implementation, the photodetecting/emitting layer 218 may include multiple sublayers and organic light-emitting diodes (OLEDs) positioned on a substrate 219. An OLED sublayer may include transparent or translucent regions, which can allow light to pass through sublayers of the photodetecting/emitting layer 218. An individual OLED element may be biased to operate as either a photodetector element or a photoemitting element. In one implementation, as shown in FIG. 2, at least one photodetecting element and one or more separate photoemitting elements are included in a single pixel. In an alternative implementation, an individual OLED element may be selectively biased to operate as either a photodetecting element or a photoemitting element. Other electronic device components 217 are shown immediately below the image sensing display 200, although intervening layers may exist.

In one implementation, the photodetecting/emitting layer 218 includes an array of pixels, such as pixels 222, wherein each pixel includes at least one photoemitting element, such as photoemitting elements 226, and at least one photodetecting element, such as photodetecting elements 224. In the photodetecting/emitting layer 218, each pixel is shown as including three photoemitting elements (e.g., red, green, and blue) and a photodetecting element, although other configurations are contemplated. As shown, the photodetecting elements and photoemitting elements of each pixel are configured in different sublayers or planes, wherein light reflected by total internal reflection from a refractory boundary at the display surface 210 can pass through the transparent or translucent regions of the photodetecting/emitting layer 218 to a photodetecting element 224. By configuring a single pixel to include photodetecting elements and photoemitting elements in different sublayers, the image sensing display 200 can provide overlapping photodetecting and photoemitting functionality without substantially increasing the thickness of the display (although typically, the implementation of FIG. 2 will be thicker than that of FIG. 1) or substantially decreasing the resolution and/or illumination of the image sensing display 200.

In the example of FIG. 2, light emitted by one of the photoemitting elements 226 is transmitted to a refractive boundary at the display surface 210 of the image sensing display 200. Light having an angle of incidence greater than a critical angle is reflected by total internal reflection through the cover glass of the image sensing display 200. Where a feature of an object (e.g., a ridge of a finger print) is optically-coupled to the display surface 210, the reflected light scatters toward the photodetecting/emitting layer 218. Where no feature of the object is optically-coupled to the display surface 210, the reflected light reflects in a non-scattered manner toward the photodetecting/emitting layer 218. The non-scattered reflected light and the ridge-scattered reflected light are captured by a photodetecting element 228. As described in more detail below, the photoemitting elements 226 of array of pixels 222 can scan a region of the display surface 210 of the image sensing display 200 to illuminate an object on the display surface 210 and can capture light reflecting off the display surface 210 using the photodetecting elements 224 of the array of pixels 222. The captured light can then be stitched together to yield a composite image of the object.

Figure 3:
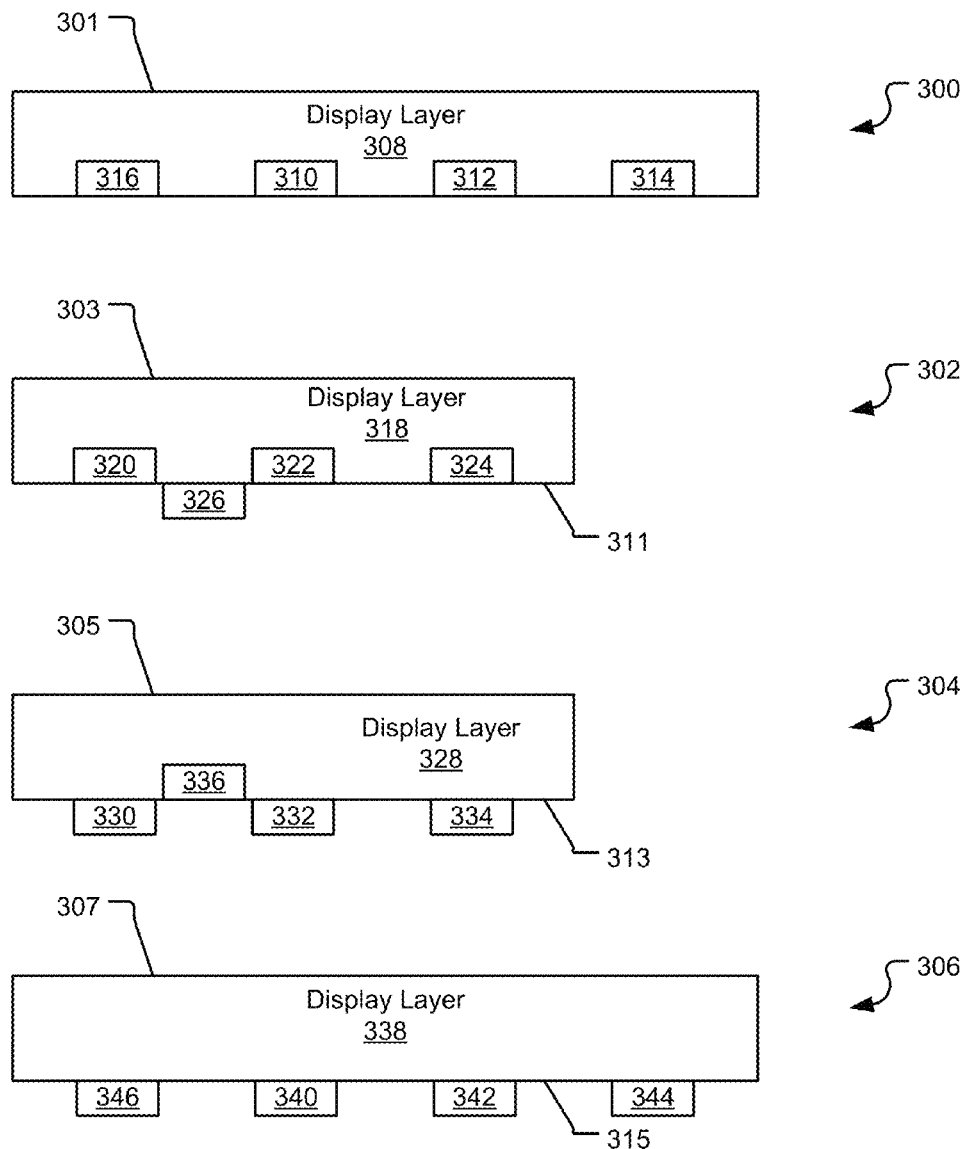
FIG. 3 illustrates example photoemitter and photodetector pixel configurations for an image sensing display of an electronic device.

FIG. 3 illustrates example photoemitter and photodetector pixel configurations 300, 302, 304, and 306 for an image sensing display of an electronic device. Each pixel configuration 300, 302, 304, and 306 illustrates a single pixel that can be part of a display array of pixels in an image sensing display. The different pixel configurations 300, 302, 304, and 306 provide tradeoffs among display resolution, illumination intensity, image detection resolution, manufacturing difficulty, etc. Other configurations are also contemplated.

In the pixel configuration 300, a display layer 308 includes a cover glass and other optical sublayers. Various display sublayer combinations are contemplated. Within the pixel configuration 300, three photoemitting elements 310, 312, and 314 and a photodetecting element 316 are embedded within the display layer 308. Some portion of the light emitted from the photoemitting elements 310, 312, and 314 passes through the cover glass to the display surface 301, is reflected by total internal reflection off the refractive boundary at the display surface of the cover glass (e.g., scattering off points of optical coupling with features of an object, such as one or more ridges of a finger) back into the display layer 308 to be captured by one or more display-layer-embedded photodetecting elements (such as element 316) of the pixels in the display array. Responsive to a scan of light across the one or more objects, the reflected light captured by the photodetecting elements is then combined or stitched together to yield a composite image of the one or more objects.

In the pixel configuration 302, a display layer 318 includes a cover glass and other optical sublayers. Various display sublayer combinations are contemplated. Within the pixel configuration 302, three photoemitting elements 320, 322, and 324 are embedded within the display layer 318 and a photodetecting element 326 is bonded to the surface 311 of the display layer 318 that is opposite to the display surface 303 of the display layer 318. Some portion of the light emitted from the photoemitting elements 320, 322, and 324 passes through the cover glass to the display surface 303, is reflected by total internal reflection off the refractive boundary at the display surface 303 of the cover glass (e.g., scattering off points of optical coupling with features of an object, such as one or more ridges of a finger) back into the display layer 318 to be captured by one or more display-layer-bonded photodetecting elements (such as element 326) of the pixels in the display array. Responsive to a scan of light across the one or more objects, the reflected light captured by the photodetecting elements is then combined or stitched together to yield a composite image of the one or more objects.

In the pixel configuration 304, a display layer 328 includes a cover glass and other optical sublayers. Various display sublayer combinations are contemplated. Within the pixel configuration 304, three photoemitting elements 330, 332, and 334 are bonded to the surface 313 of the display layer 328 that is opposite to the display surface 305 of the display layer 328 and a photodetecting element 336 is embedded within the display layer 328. Some portion of the light emitted from the photoemitting elements 330, 332, and 334 passes through the cover glass to the display surface 305, is reflected by total internal reflection off the refractive boundary at the display surface of the cover glass (e.g., scattering off points of optical coupling with features of an object, such as one or more ridges of a finger) back into the display layer 328 to be captured by one or more display-layer-embedded photodetecting elements (such as element 336) of the pixels in the display array. Responsive to a scan of light across the one or more objects, the reflected light captured by the photodetecting elements is then combined or stitched together to yield a composite image of the one or more objects.

In the pixel configuration 306, a display layer 338 includes a cover glass and other optical sublayers. Various display sublayer combinations are contemplated. Within the pixel configuration 306, three photoemitting elements 340, 342, and 344 and a photodetecting element 346 are bonded to the surface 315 of the display layer 338. Some portion of the light emitted from the photoemitting elements 340, 342, and 344 passes through the cover glass to the display surface 307, is reflected by total internal reflection off the refractive boundary at the display surface of the cover glass (e.g., scattering off points of optical coupling with features of an object, such as one or more ridges of a finger) back into the display layer 338 to be captured by one or more display-layer-bonded photodetecting elements (such as element 346) of the pixels in the display array. Responsive to a scan of light across the one or more objects, the reflected light captured by the photodetecting elements is then combined or stitched together to yield a composite image of the one or more objects.

Other configurations may also be employed including different photodetecting/photoemitting element ratios (the ratio illustrated in FIG. 3 shows three photoemitting elements for each photodetecting element), different combinations of display sublayers, etc. In one implementation, photodetecting elements and photoemitting elements of a single pixel are controlled by a shared bus through control circuitry. The control circuitry selectively turns on and off individual photodetecting/photoemitting elements of one or more pixels based on the control signals received on the shared bus.

Figure 4:
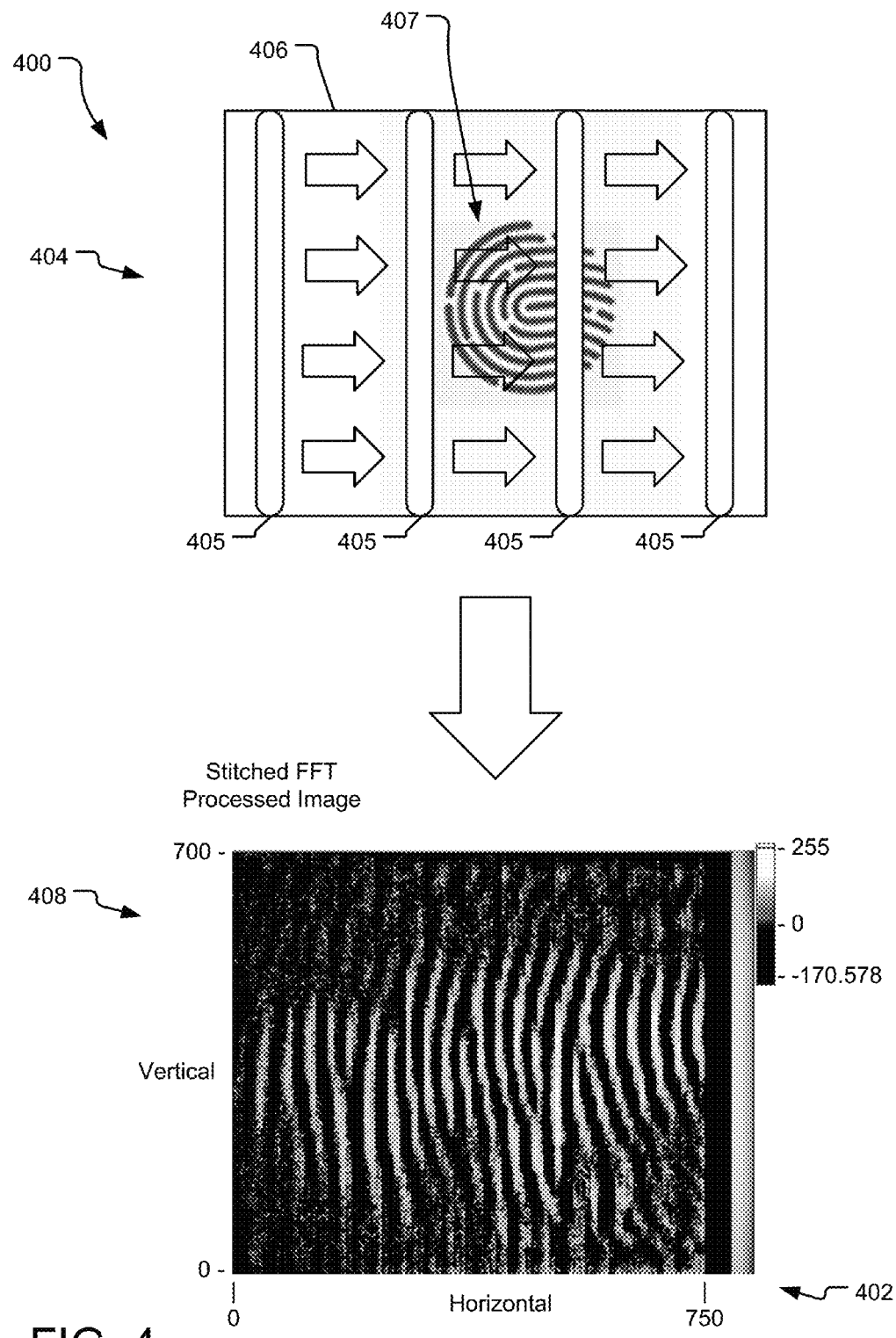
FIG. 4 illustrates an example fingerprint scanning process and an example resulting image.

FIG. 4 illustrates an example fingerprint scanning process 400 and an example resulting image 402. In a first stage 404, individual rows (or combinations of rows) of photoemitting elements are turned on in a scanning mode (as represented by the arrows), such that emitted light 405 scans across an image detection region 406 of the display surface. Some portion of the scanning light passes through the display surface, where it selectively reflects from the refractive boundary at the display surface (scattering off points of optical coupling with features of an object, such as one or more ridges 407 of a finger, on the display surface) back through the display's cover glass for capture by photodetectors embedded in the display or bonded to a surface of the display.

The first stage 404 shows a progression of illuminating light 405 emitted from photoemitting elements in display pixels scanning across the image detection area 406. Some of the illuminated light is selectively reflected from the refractive boundary at the display surface (scattering off points of optical coupling with features of an object, such as one or more ridges 407 of a finger, on the display surface) back through the display's cover glass for detection by photodetectors. In one implementation, captured light is captured in front of the scanning row as it scans across the image detection region 406. In a second stage 408, the captured light signals are recorded in memory, high pass filtered (e.g., using a Fast Fourier Transform (FFT) filter to remove noise from the image), and stitched together to form a composite image 402 of the object features. In one implementation, portions or blocks of the captured reflected light are selected based on the signal-to-noise ratio for use in the stitching process.

Stitching involves combining multiple captured light signals having overlapping fields of view to generate a high-level image having an area larger than any single field of view of the photodetecting elements. For example, the reflected light from the image detection region 406 is captured by multiple photodetectors having a small field of view as compared to the overall area of the image detection region 406, and the captured light is combined into a resulting image 402 that represents most of the image detection region 406. The resulting image 402 substantially reproduces the image features that contact the display surface (in the example, reproducing the fingerprint ridges 407).

It should be understood that scanning, whether for illumination or photodetection, shapes need not be limited to lines, columns or rows. In one implementation, scanning is performed, for either or both of illumination and photodetection, in blocks, rings, etc. Furthermore, in one implementation, partial images that are roughly in a ring shape are detected by the photodetectors and stitched together to form the resulting composite image. Example rings may be a millimeter or two in outer diameter, centered on a single photoemitting element, although other implementation may be employed.

Figure 5:
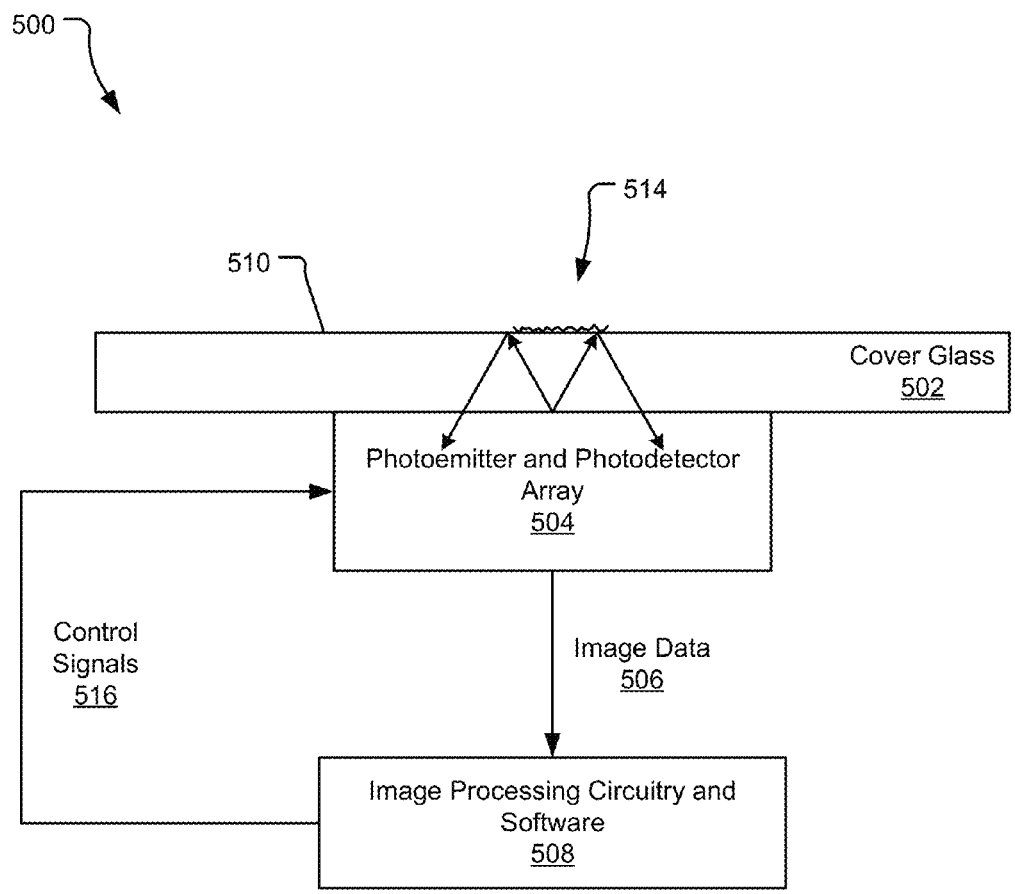
FIG. 5 illustrates an example schematic of an image sensing system for a display of an electronic device.

FIG. 5 illustrates an example schematic of an image sensing system 500 for a display of an electronic device. The display includes a cover glass 502 for which at least a portion of the display area is occupied by a photoemitter/detector array 504 (e.g., any remaining display may merely be occupied by a photoemitter array, without any photodetectors). Responsive to control signals 516 provided by image processing circuitry and software 508, photoemitting elements in the photoemitter/detector array 504 emit scanning light through the cover glass 502. Some portion of the scanning light is reflected from a refractive boundary at the surface 510, and some portion of the reflected light is scattered off object features 514 optically-coupled at the surface 510 of the cover glass 502. The reflected light, including the feature-scattered light, is captured by photodetecting elements in the photoemitter/detector array 504 and transmitted to the image processing circuitry and software 508.

In one implementation, the photoemitter/detector array 504 includes a 300 ppi sensor array having a sensing area of 1.0"×0.8". At 8 bits/pixel, the photoemitter/detector array 504 can be calculated to capture 576,000 bits/frame (i.e., (300×1.0)×(300×0.8)×8), although other photoemitter/detector array 504 configurations may be employed. Assuming the above-described 576,000 bits/frame metric and a 60 frame/sec scan rate, the photoemitter/detector array 504 provides a data rate of 34,560,000 bits/sec of scanned image data 506 being sent to the image processing circuitry and software 508, which stitches the scans of captured light together into a composite image representing the scanned object (e.g., a fingerprint).

Figure 6:
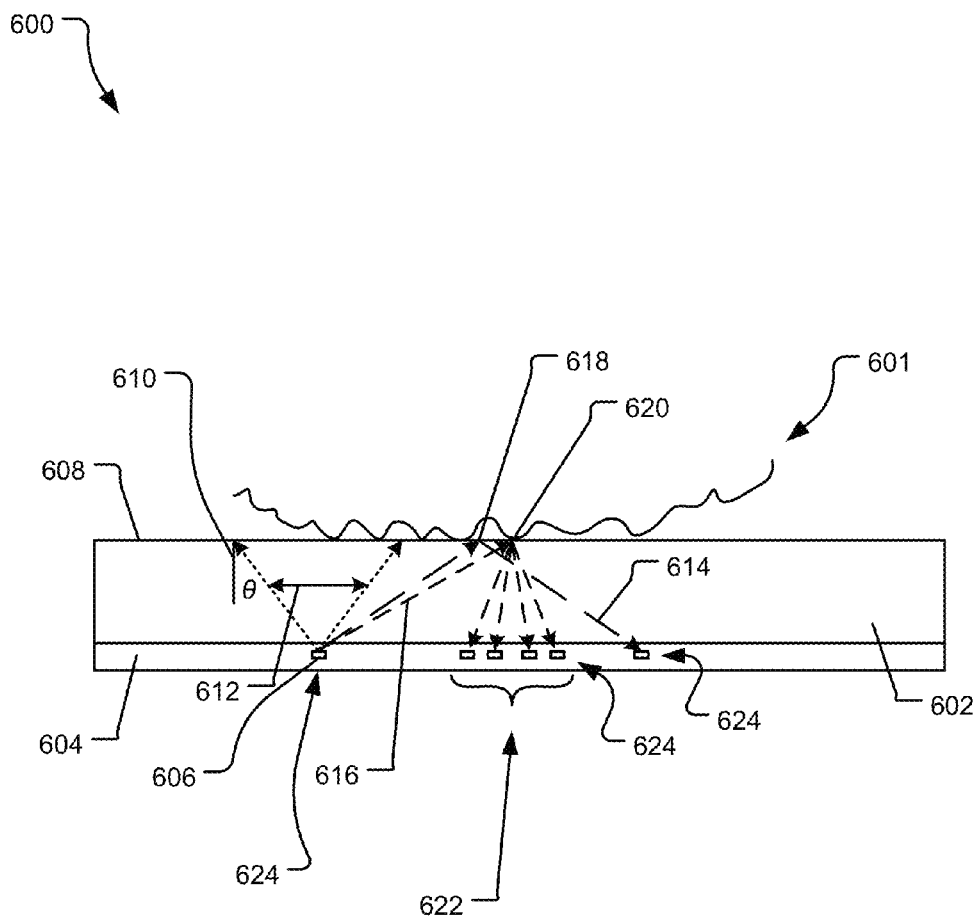
FIG. 6 illustrates an example use of total internal reflection (TIR) for image sensing with a display of an electronic device.

FIG. 6 illustrates an example use 600 of total internal reflection (TIR) for image sensing with a display 602 of an electronic device. The display 602 includes a photodetecting/emitting layer 604 having a pixelated photodetecting element array (such as an array including photodetecting elements 624) and a pixelated photoemitting element array (such as an array including a photoemitting element 625). Pixelated refers to dividing an array into individual pixels for display and/or photodetection in a digital format. In some cases, a pixel in a pixelated display may be referenced based on a column and/or row selection, although other referencing frameworks may be employed.

The example use 600 depicts light emitted from a photoemitting element 606 of the pixelated photoemitting element array toward a display surface 608 of a cover glass of the display 602. The light strikes the display surface 608, internal to the cover glass, wherein the display surface 608 operates as a medium boundary (or refractive boundary) between the cover glass and the atmosphere outside the electronic device.

When a propagating light wave strikes a refractive boundary, the wave's interaction with that boundary can vary depending on the relative refractive indices of the materials on each side of the refractive boundary and on the wave's angle of incidence (i.e., the angle at which the light wave strikes the refractive boundary with respect to the normal to that boundary—see θ and the normal 610). In the case of the display 602, the refractive index of the display's cover glass is greater than the refractive index of the atmosphere outside the display. Accordingly, if the light wave's angle of incidence is less than the critical angle $\theta_C$ of the refractive boundary, some of the light wave will pass through the refractive boundary and some of the light wave will be reflected back into the cover glass. (The critical angle $\theta_C$ is dependent upon the relative refractive indices of the materials on each side of the refractive boundary, according to Snell's Law.) If the angle of incidence precisely equals the critical angle $\theta_C$, then the light wave is refracted along the refractive boundary. If the angle of incidence is greater than the critical angle $\theta_C$, then the entire light wave is reflected back into the cover glass without transmission into the atmosphere, according to the principle of total internal reflection (TIR). The reflected light waves are captured by one or more photodetecting elements in the photodetecting/emitting layer 604. In this manner, the pixelated photoemitting element array communicates with the pixelated photodetecting element array 624 through total internal reflection in the cover glass of the display 602.

Example light waves shown in FIG. 6 provide a more detailed illustration of imaging of features of an object, such as ridges of a finger 601, on the surface of the display 602. Light waves having an angle of incidence that is less than the critical angle $\theta_C$ are transmitted through the cover glass within the angle shown by arrow 612. Such waves are substantially transmitted through the display surface 608, and any portion of such waves that are reflected back through the cover glass are nominal in comparison to the light waves 614 and 616, which have an angle of incidence with the display surface 608 that is greater than the critical angle $\theta_C$ and are reflected back into the glass through total internal reflection.

The light wave 614 intersects the display surface 608 at a point 618 where there is no ridge of the fingerprint (i.e., there is a feature of the object at the point 618) in contact with the display surface 608. As such, the light wave 614 is reflected (as a non-feature portion of the reflected light) with substantially the same intensity back through the cover glass for capture by photodetecting elements in the photodetecting/emitting layer 604.

In contrast, the light wave 616 intersects the display surface 608 at a point 620 where there is a ridge of the fingerprint (i.e., a feature of the object) in contact with the display surface 608. The optical coupling at the point 620 of contact results in a weaker localized reflected light signal at each photodetecting element (e.g., because of frustrated total internal reflection and/or other effects), in which the light wave 616 is reflected in a scatter pattern 622 back through the cover glass for capture by photodetecting elements in the photodetecting/emitting layer 604. The scatter pattern 622 results in the intensity of reflected light from the light wave 616 at any particular location of the pixelated photodetecting element array 624 being less than the captured light from the light wave 614. As such, light detection associated with the fingerprint ridges generally exhibits a lower light intensity than light detection associated with the fingerprint valleys. Image processing circuitry and/or software can further process the resulting composite image to invert the intensities (e.g., to provide a more tonally accurate image) or to otherwise enhance the image.

Figure 7:
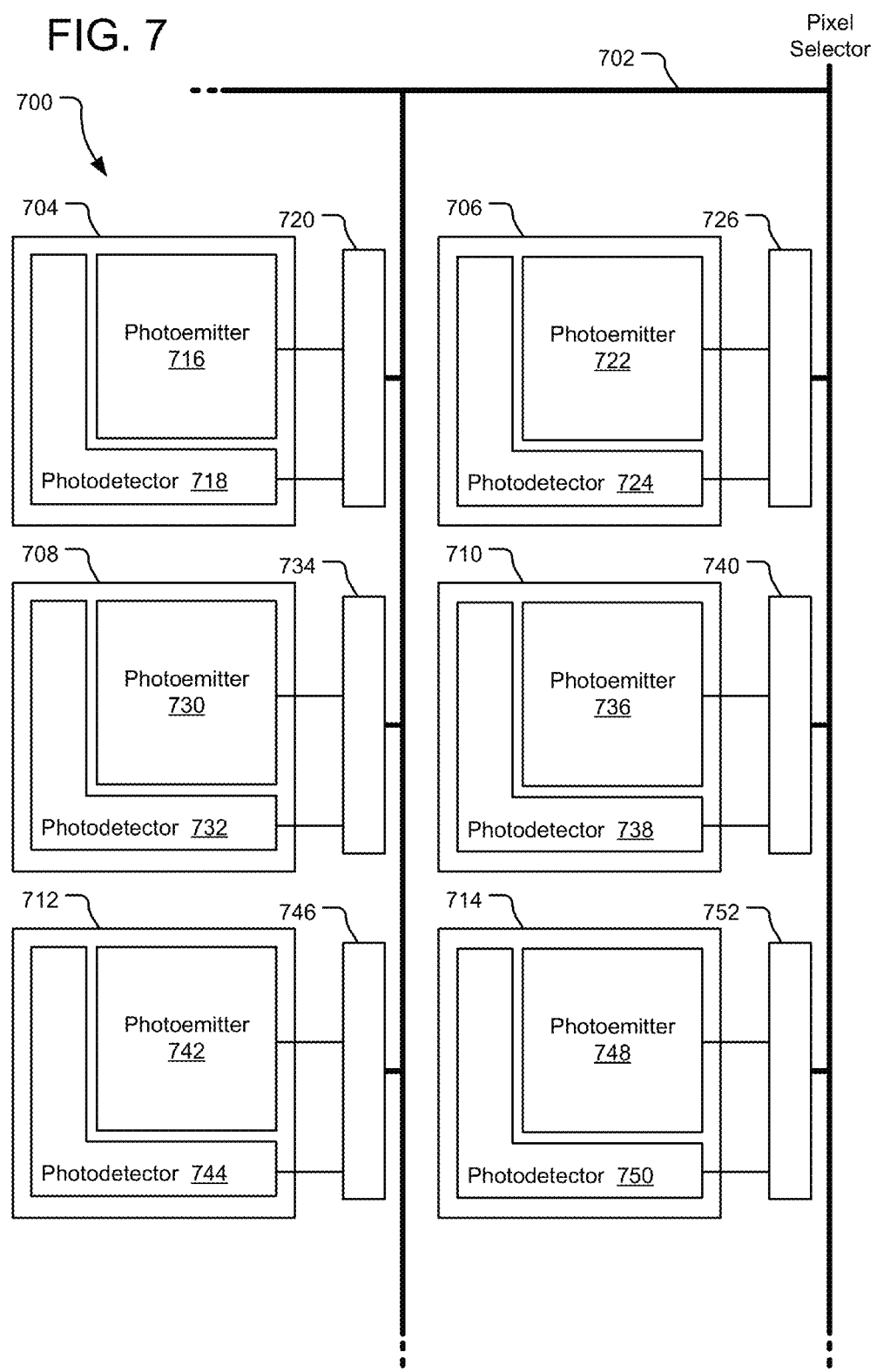
FIG. 7 illustrates an example pixel array, wherein each pixel includes a photoemitting element and a photodetecting element occupying distinct areas of the pixel.

FIG. 7 illustrates an example pixel array 700, wherein each pixel includes a photoemitting element and a photodetecting element occupying distinct areas of the pixel. The pixel array 700 is controlled by sensor control instructions via a pixel selector signal bus 702, which selects the row and column of each pixel that is selected to emit light for imaging and/or that is selected to detect light reflected from the refractive boundary at the display surface. It should be understood that the example pixels shown in FIG. 7 are a subset of the pixels that will typically extend across the entire area of the display or across a predetermined area of the display (e.g., a fingerprint sensing region).

A pixel (such as pixels 704, 706, 708, 710, 712, and 714) includes a photodetector including one or more photodetecting elements and a photoemitter including one or more photoemitting elements (such as red, green, and blue photoemitting elements). Each photodetector shares pixel area with a corresponding photoemitter, substantially in the same layer of the display, although individual photodetectors and photoemitters may occupy different layers in some implementations. In one implementation, a photodetector occupies a layer positioned below the photoemitter, and reflected light is transmitted through a cover glass of the display and through a transparent or translucent material or substrate binding the photoemitters together in the pixel array 700. In other implementations, a photoemitter occupies a layer positioned below a photodetector of the same pixel, and light is emitted through a transparent or translucent material into the cover glass of the display. The reflected light is then detected by the photodetector on the layer positioned above the photoemitter.

Each pixel is also associated with driver electronics, which control the operation of the photodetector and photoemitter of the pixel, including without limitation interpreting row/column selector signals to determine which pixel is selected by sensor control instructions via a pixel selector signal bus and/or interpreting whether to turn the pixel on as a photoemitter or a photodetector. In one implementation, each pixel is controlled by a pixel selection signal communicated by single pixel selection signal bus input to the pixel. The pixel selector signal bus 702, can include a portion of the bus that provides an address or a pixelated row and/or column location in the photodetecting/emitting arrays of the display. For example, the pixel selection signal may specify one or more rows and one or more columns of pixels in the pixel array 700, and each specified pixel turns on the photoemitter or the photodetector as specified in the pixel selection signal.

In the illustrated implementation, each pixel includes a photodetector and a separate photoemitter. In other implementations, a photoemitting element may be reverse-biased to operate as a photodetecting element, such that a pixel includes a circuit that operates as either a photoemitter or a photodetector, depending on the voltage applied to the circuit. An output data signal component is communicated back to the image processing circuitry and software of the system (e.g., via the pixel selector signal bus 702).

As shown in FIG. 7, the pixel 704 includes a photoemitter 716 and a photodetector 718, and is coupled to driver electronics 720, which may be outside or within the areal bounds of the pixel 704 (whether in the same plane or a different plane). The driver electronics 720 receive the pixel selection signal from the pixel selection signal bus 702 and interprets the pixel selection signal to determine whether the pixel 704 is selected for operation and/or whether the photoemitter 716 or the photodetector 718 is selected for operation. In one implementation, the photoemitter versus photodetector selection is selected based on a polarity of a signal component on the pixel selection signal bus 702, although other photoemitter versus photodetector selection modes may be employed. Similar pixels of the pixel array 700 are shown in FIG. 7 (the pixel 706 with a photoemitter 722 and a photodetector 724, associated with driver electronics 726; the pixel 708 with a photoemitter 730 and a photodetector 733, associated with driver electronics 734; the pixel 710 with a photoemitter 736 and a photodetector 738, associated with driver electronics 740; the pixel 712 with a photoemitter 742 and a photodetector 744, associated with driver electronics 746; and the pixel 714 with a photoemitter 748 and a photodetector 750, associated with driver electronics 752), and the pixel array 700 will typically include other similarly configured pixels across a portion of the display or across the entire display.

Figure 8:
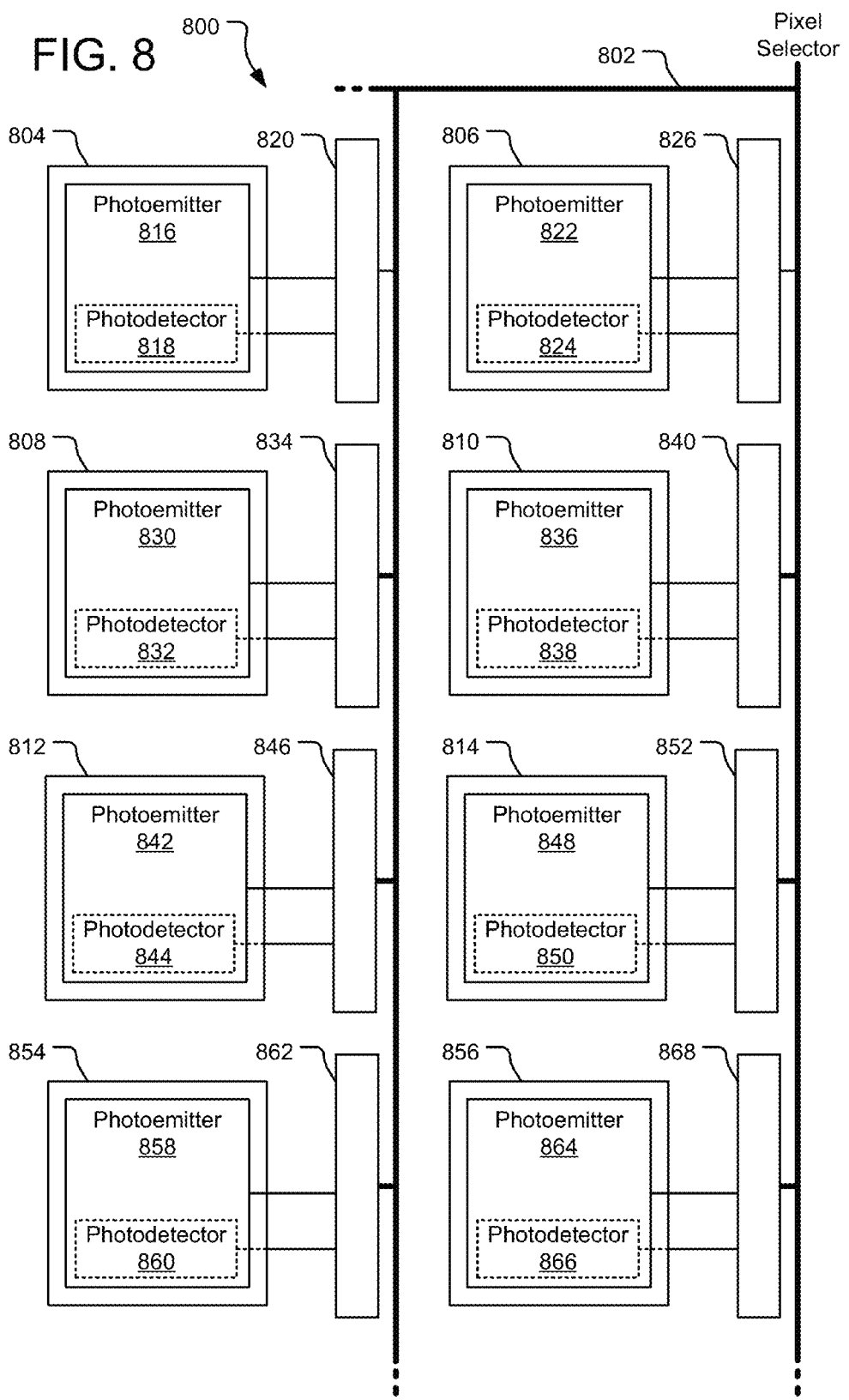
FIG. 8 illustrates an example pixel array, wherein each pixel includes a photoemitting element and a photodetecting element occupying overlapping areas of the pixel.

FIG. 8 illustrates an example pixel array 800, wherein each pixel includes a photoemitting element and a photodetecting element occupying overlapping areas of the pixel. The pixel array 800 is controlled by sensor control instructions via a pixel selector signal bus 802, which selects the row and column of each pixel that is selected to emit light for imaging and/or that is selected to detect light reflected from the refractive boundary at the display surface. It should be understood that the example pixels shown in FIG. 8 are a subset of the pixels that will typically extend across the entire area of the display or across a predetermined area of the display (e.g., a fingerprint sensing region).

A pixel (such as pixels 804, 806, 808, 810, 812, 814, 854, and 856) includes a photodetector including one or more photodetecting elements and a photoemitter including one or more photoemitting elements (such as red, green, and blue photoemitting elements). Each photodetector overlaps a corresponding photoemitter of the same pixel and occupies a different layer of the display. In the illustrated implementation, the photodetector 818 occupies a layer positioned below the photoemitter 816, and reflected light is transmitted through a cover glass of the display and through a transparent or translucent material or substrate binding the photoemitters together in the pixel array 800. In other implementations, a photoemitter occupies a layer positioned below a photodetector of the same pixel, and light is emitted through a transparent or translucent material into the cover glass of the display. The reflected light is then detected by the photodetector on the layer positioned above the photoemitter.

Each pixel is also associated with driver electronics, which control the operation of the photodetector and photoemitter of the pixel, including without limitation interpreting row/column selector signals to determine which pixel is selected by sensor control instructions via a pixel selector signal bus and/or interpreting whether to turn the pixel on as a photoemitter or a photodetector. In one implementation, each pixel is controlled by a pixel selection signal communicated by single pixel selection signal bus input to the pixel. The pixel selector signal bus 802, can include a portion of the bus that provides an address or a pixelated row and/or column location in the photodetecting/emitting arrays of the display. For example, the pixel selection signal may specify one or more rows and one or more columns of pixels in the pixel array 800, and each specified pixel turns on the photoemitter or the photodetector as specified in the pixel selection signal.

In the illustrated implementation, each pixel includes a photodetector and a separate photoemitter. In other implementations, a photoemitting element may be reverse-biased to operate as a photodetecting element, such that a pixel includes a circuit that operates as either a photoemitter or a photodetector, depending on the voltage applied to the circuit. An output data signal component is communicated back to the image processing circuitry and software of the system (e.g., via the pixel selector signal bus 702).

As shown in FIG. 8, the pixel 804 includes a photoemitter 816 and a photodetector 818, and is coupled to driver electronics 820, which may be outside or within the areal bounds of the pixel 804, whether in the same plane or a different plane). The driver electronics 820 receive the pixel selection signal from the pixel selection signal bus 802 and interprets the pixel selection signal to determine whether the pixel 804 is selected for operation and/or whether the photoemitter 816 or the photodetector 818 is selected for operation. In one implementation, the photoemitter versus photodetector selection is selected based on a polarity of a signal component on the pixel selection signal bus 802, although other photoemitter versus photodetector selection modes may be employed. Similar pixels of the pixel array 800 are shown in FIG. 8 (the pixel 806 with a photoemitter 822 and a photodetector 824, associated with driver electronics 826; the pixel 808 with a photoemitter 830 and a photodetector 832, associated with driver electronics 834, the pixel 810 with a photoemitter 836 and a photodetector 838, associated with driver electronics 840; the pixel 812 with a photoemitter 842 and a photodetector 844, associated with driver electronics 846; the pixel 814 with a photoemitter 848 and a photodetector 850, associated with driver electronics 852; the pixel 854 with a photoemitter 858 and a photodetector 860, associated with driver electronics 862; and the pixel 856 with a photoemitter 864 and a photodetector 866, associated with driver electronics 868), and the pixel array 800 will typically include other similarly configured pixels across a portion of the display or across the entire display.

Figure 9:
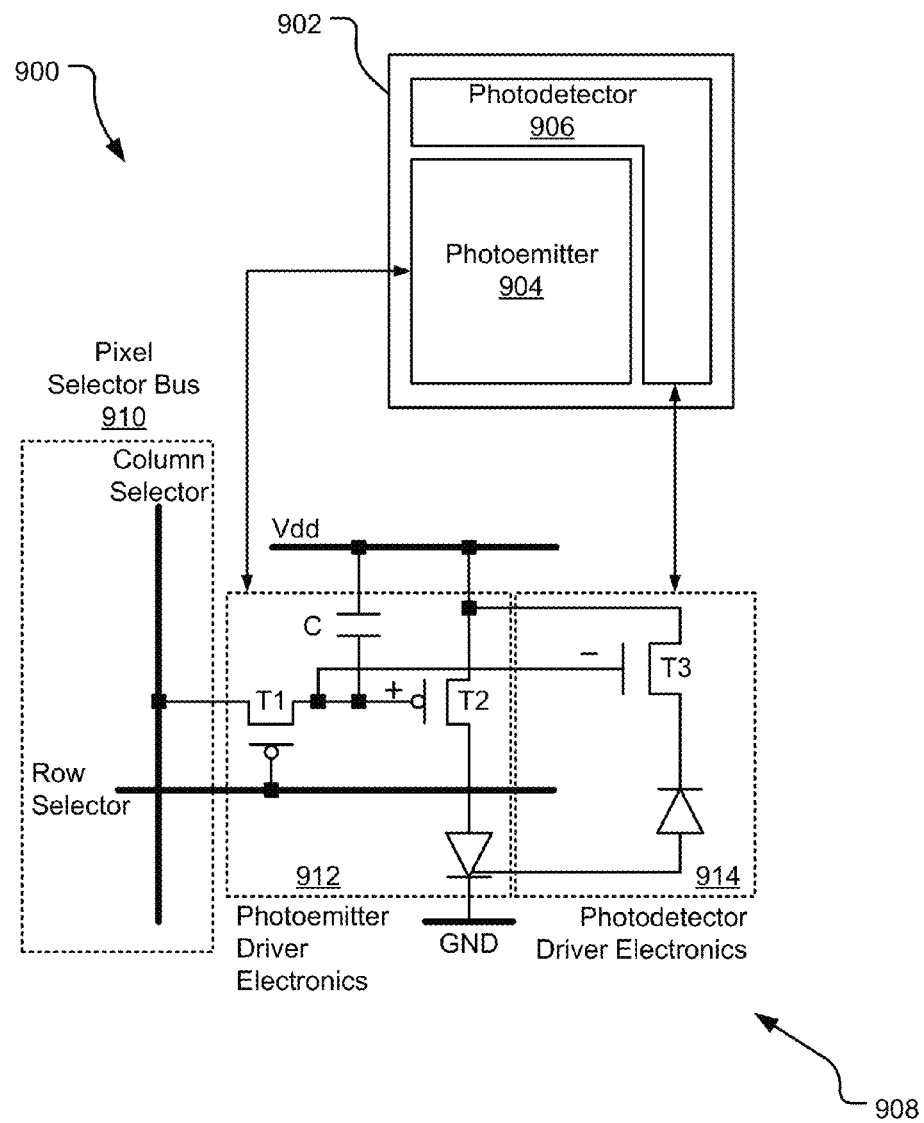
FIG. 9 illustrates a schematic of an example pixel drive electronic circuit for a pixel having one or more photoemitting elements in a photoemitter and one or more photodetecting elements in a photodetector.

FIG. 9 illustrates a schematic of an example pixel driver electronics circuit 900 for a pixel 902 having one or more photoemitting elements in a photoemitter 904 and one or more photodetecting elements in a photodetector 906. Row and column selector signals are communicated to the driver electronics 908 via a pixel selector bus 910, the column selector signal including a component signal for selecting whether the pixel 902 should operate as a photodetector or a photoemitter. In the illustrated implementation, the polarity of a signal component of the column selector bus provides this emitter/detector selection functionality. If the signal component is positive, then a transistor T2 of the photoemitter driver electronics 912 is turned on and a transistor T3 of the photodetector driver electronics 914 is turned off, causing the photoemitter 904 of the pixel 902 to turn on and emit light and the photodetector 906 of the pixel 902 to turn off. If the signal component is negative, then the transistor T3 of the photodetector driver electronics 914 is turned on and the transistor T2 of the photoemitter driver electronics 912 is turned off, causing the photodetector 906 of the pixel 902 to turn on and detect light reflected from the cover glass display surface interface by total internal reflection and causes the photoemitter 914 of the pixel 902 to turn off.

The schematic of FIG. 9 illustrates an example of selecting whether a single pixel, having both photodetecting and photoemitting elements, can be controlled by a single pixel selector signal bus to operate as either a photodetector or a photoemitter. Other single bus designs are also contemplated. Furthermore, in implementations in which a single element of a pixel may be switched from a photoemitter to a photodetector (and vice versa) according to a bias voltage (e.g., reversing a voltage bias causes the element to switch to the opposite functionality), the bias voltage can also be controlled by a signal component of the single pixel selector signal bus.

Figure 10:
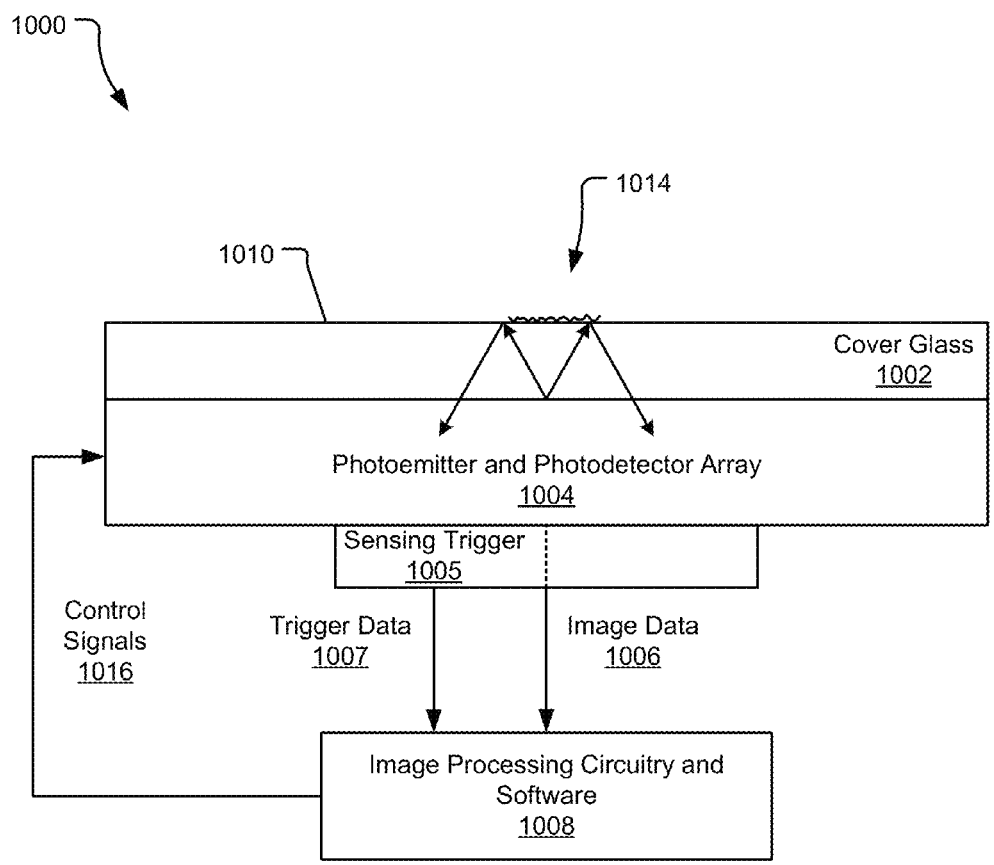
FIG. 10 illustrates a schematic of an example triggered image sensing system for a display of an electronic device.

FIG. 10 illustrates a schematic of an example triggered image sensing system 1000 for a display of an electronic device. The display includes a cover glass 1002 for which at least a portion of the display area is occupied by a photoemitter/detector array 1004 (e.g., any remaining display may merely be occupied by a photoemitter array, without any photodetectors). A sensing trigger 1005, as example means for initiating an imaging scan, is positioned to detect location of an action intended to initiate an imaging scan operation, such as detection of a conductive object in proximity to the sensing trigger 1005, in the case of a capacitive sensor, for example. In an alternative implementation, the sensing trigger 1005 includes a pressure sensor to detect a location of pressure applied to the region of the cover glass 1002 above the sensing trigger 1005, such as pressure applied by a finger pressed against the cover glass 1002. Another example sensor for detecting the location to be imaged may include a resistive sensor. In yet another alternative implementation, the triggering sensor may be embedded in the display of the electronic device without substantially adding thickness to the display (e.g., within the same layer by within the bezel or by with a user-manipulated button in the bezel, the side of the electronic device or the back-side of the electronic device).

In such implementations, the sensing trigger 1005 allows the triggered image sensing system 1000 to refrain from scanning the display area with the photoemitters and photodetectors until the imaging scan is triggered by the sensing trigger 1005, thereby conserving power and processing resources. For example, upon sensing an initiating action intended to initiate an imaging operation, such as a finger press on the display surface, the sensing trigger 1005 can transmit trigger data 1007 to image processing circuitry and software 1008 to initiate an imaging scan. It should be noted that the sensing trigger 1005 may be in overlapping proximity within the display, although other implementations may employ a separate sensing trigger 1005, such as a home button, a power button, or another display-based control. The display may present a visible prompt on the display to indicate to a user the area of the display that will be image scanned (e.g., the area on which to place a finger for fingerprint scanning).

Responsive to control signals 1016 provided by image processing circuitry and software 1008, photoemitting elements in the photoemitter/detector array 1004 emit scanning light through the cover glass 1002. Some portion of the scanning light is reflected from a refractive boundary at the surface 1010, and some portion of the reflected light is scattered off object features 1014 optically-coupled at the surface 1010 of the cover glass 1002. The reflected light, including the feature-scattered light, is captured by photodetecting elements in the photoemitter/detector array 1004 and transmitted to the image processing circuitry and software 1008 from the photoemitter/detector array 1004.

In one implementation, the imaging scan can also be localized to an area of the display corresponding to the sensing trigger 1005, such that means for localizing the imaging scan includes the sensing trigger 1005. For example, in a configuration in which the photoemitter/detector array 1004 occupies a large area (or the entire area) of the display, the location at which the initiating action is detected can be communicated to the image processing circuitry and software 1008 with the trigger data 1007 (as location data) so that the image processing circuitry and software 1008 can localize the image scanning to the area of the sensed initiation action by limiting the control signals 1016 to a corresponding area of the photoemitter/detector array 1004.

In one implementation, the photoemitter/detector array 1004 includes a 300 ppi sensor array having a sensing area of 1.0"×0.8". At 8 bits/pixel, the photoemitter/detector array 1004 can be calculated to capture 576,000 bits/frame (i.e., (300×1.0)×(300×0.8)×8), although other photoemitter/detector array 1004 configurations may be employed. Assuming the above-described 576,000 bits/frame metric and a 60 frame/sec scan rate, the photoemitter/detector array 1004 provides a data rate of 34,560,000 bits/sec of scanned image data 1006 being sent to the image processing circuitry and software 1008, which stitches the scans of captured light together into a composite image representing the scanned object (e.g., a fingerprint).

Figure 11:
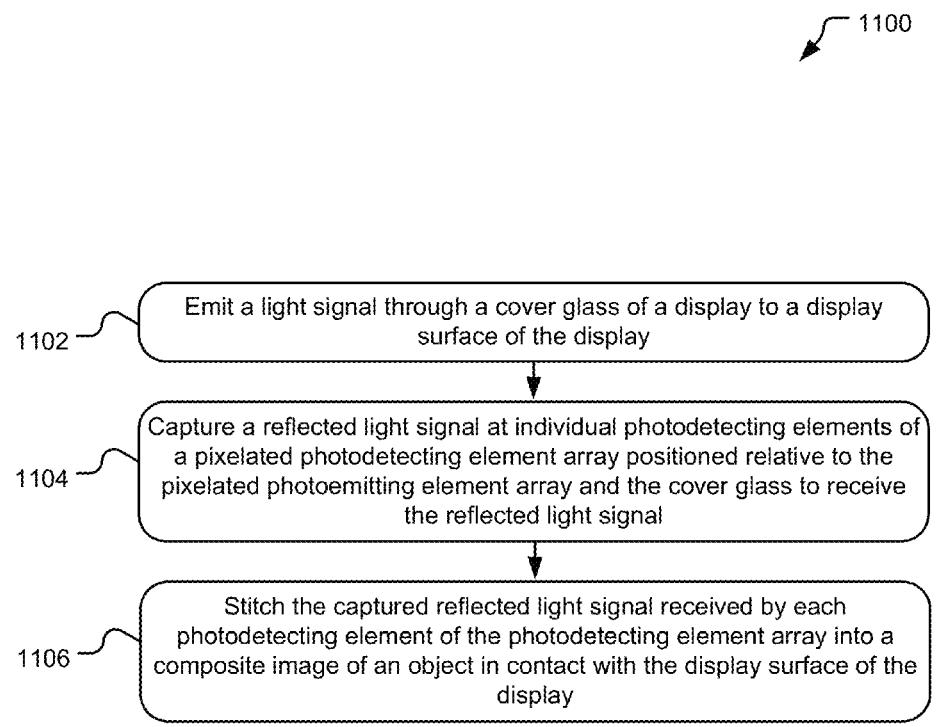
FIG. 11 illustrates example operations for image sensing with a display.

FIG. 11 illustrates example operations 1100 for image sensing with a display. An emitting operation 1102 emits a light signal through a cover glass of a display to a display surface of the display. The light signal is emitted from one or more selected photoemitting elements of a pixelated photoemitting element array of the display. A capture operation 1104 captures a reflected light signal at individual photodetecting elements of a pixelated photodetecting element array positioned relative to the pixelated photoemitting element array and the cover glass to receive the reflected light signal. The reflected light signal includes a portion of the emitted light signal reflected by total internal reflection from a refractive boundary at the display surface of the cover glass. A stitching operation 1106 stitches the captured reflected light signal received by each photodetecting element of the photodetecting element array into a composite image of an object in contact with the display surface of the display.

Figure 12:
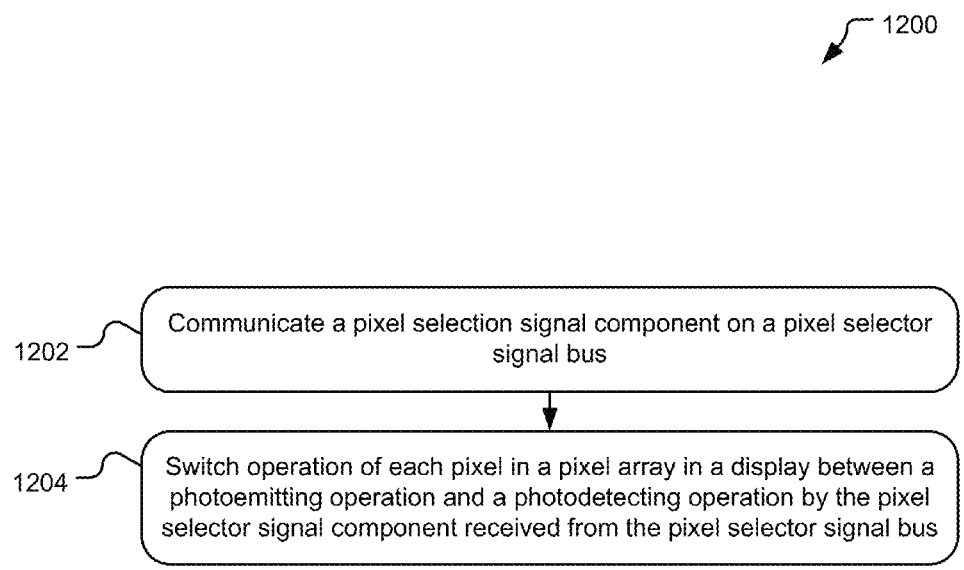
FIG. 12 illustrates example operations for switching a pixel between photoemitting mode and photodetecting mode.

FIG. 12 illustrates example operations 1200 for switching a pixel between photoemitting mode and photodetecting mode. A communication operation 1202 communicates a pixel selection signal component on a pixel selector signal bus. A switching operation 1204 switches operation of each pixel in a pixel array in a display between a photoemitting operation and a photodetecting operation by the pixel selector signal component received from the pixel selector signal bus. Each pixel in the pixel array includes one or more photodetectors and one or more photoemitting elements. The pixel array is electrically connected to the pixel selector signal bus and includes multiple pixels configured to sense an image from a surface of the display.

Figure 13:
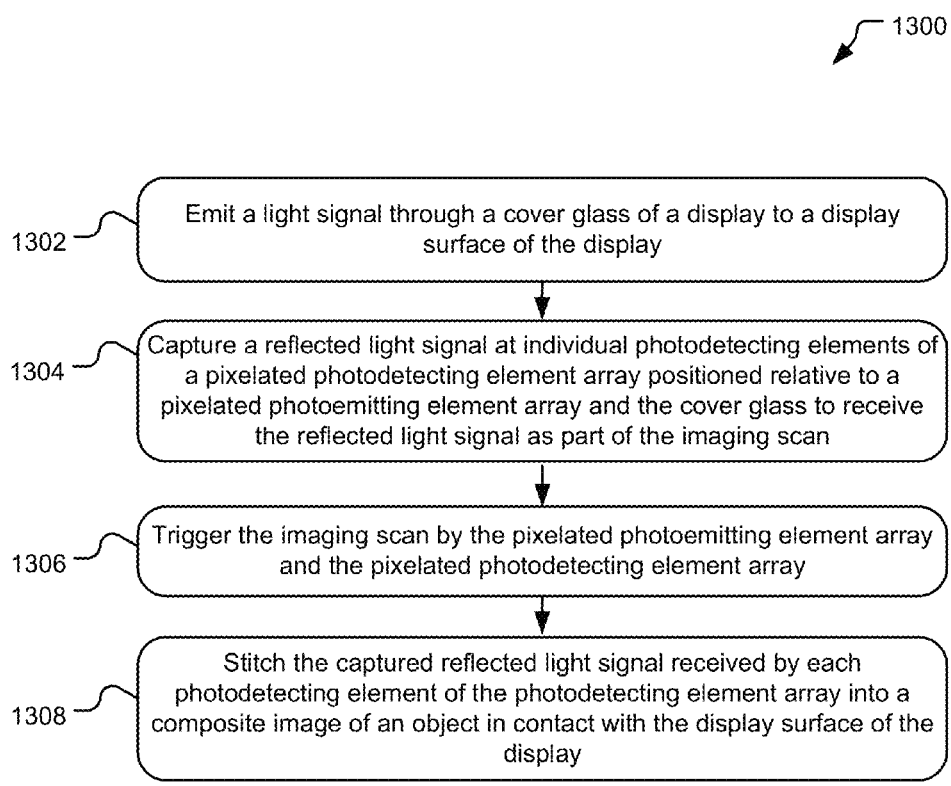
FIG. 13 illustrates example operations for triggered image sensing with a display.

FIG. 13 illustrates example operations 1300 for triggered image sensing with a display. An emitting operation 1302 emits a light signal through a cover glass of a display to a display surface of the display. The light signal is emitted from one or more selected photoemitting elements of a pixelated photoemitting element array of the display as part of an imaging scan. A capturing operation 1304 captures a reflected light signal at individual photodetecting elements of a pixelated photodetecting element array positioned relative to a pixelated photoemitting element array and the cover glass to receive the reflected light signal as part of the imaging scan. A triggering operation 1306 triggers the imaging scan by the pixelated photoemitting element array and the pixelated photodetecting element array, responsive to detection of an initiating action by a sensing trigger positioned relative to the pixelated photodetecting element array. A stitching operation 1308 stitches the captured reflected light signal received by each photodetecting element of the photodetecting element array into a composite image of an object in contact with the display surface of the display.

Figure 14:
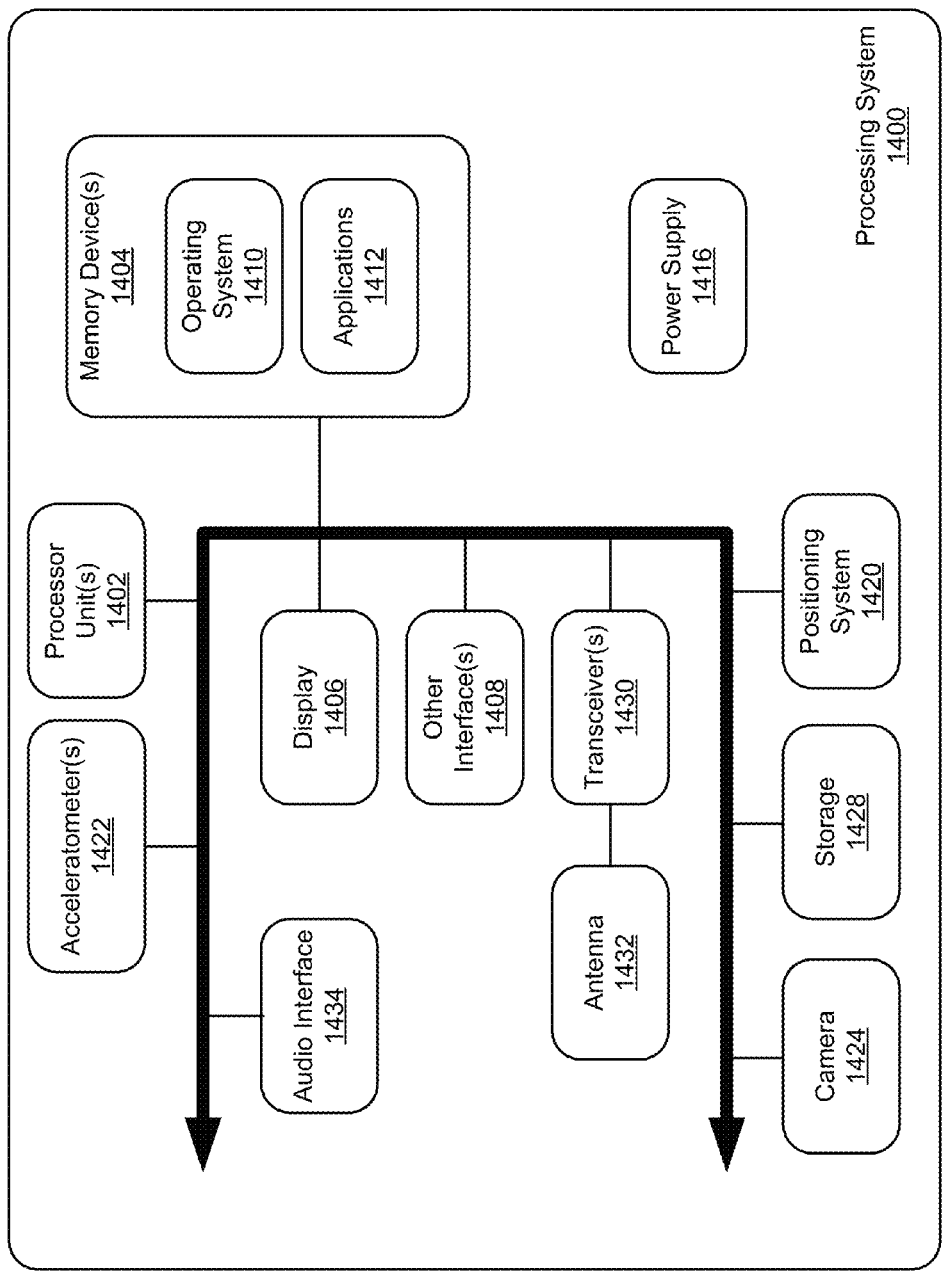
FIG. 14 illustrates an example processing system for use in image sensing and/or triggered image sensing on a display.

FIG. 14 illustrates an example processing system 1400 for use in an electronic device for image sensing and/or triggered image sensing on a display 1406. The processing system 1400 includes one or more processor units 1402 (discrete or integrated microelectronic chips and/or separate but integrated processor cores), at least one memory device 1404 (which may be integrated into systems or chips of the processing system 1400), the display 1406 (e.g., a touchscreen display, an OLED display with photodetectors, etc.), and other interfaces 1408 (e.g., a keyboard interface). The memory device 1404 generally includes both volatile memory (e.g., RAM) and non-volatile memory (e.g., flash memory). An operating system 1410, such as one of the varieties of the Microsoft Windows® operating system, resides in the memory device 1404 and is executed by at least one of the processor units 1402, although it should be understood that other operating systems may be employed. Other features of the electronic device 1400 may include without limitation a photodetecting/photoemitting layer in the display, a pixel selector signal bus, and a sensing trigger (e.g., a pressure sensor, a proximity sensor, etc.).

One or more applications 1412, such as image scanning software, triggering software, sensor control instructions, etc., are loaded in the memory device 1404 and executed on the operating system 1410 by at least one of the processor units 1402. The processing system 1400 includes a power supply 1416, which is powered by one or more batteries and/or other power sources and which provides power to other components of the processing system 1400. The power supply 1416 may also be connected to an external power source that overrides or recharges the built-in batteries or other power sources.

The processing system 1400 includes one or more communication transceivers 1430 to provide network connectivity (e.g., mobile phone network, Wi-Fi®, BlueTooth®, etc.). The processing system 1400 also includes various other components, such as a positioning system 1420 (e.g., a global positioning satellite transceiver), one or more accelerometers 1422, one or more cameras 1424, one or more audio interfaces (e.g., an audio interface, such a microphone, an audio amplifier and speaker and/or audio jack), one or more antennas (1432), and additional storage 1428. Other configurations may also be employed.

In an example implementation, a mobile operating system, various applications, modules for image scanning, triggered image scanning, image stitching, image recognition (e.g., fingerprint recognition), device access control, security, and other modules and services may be embodied by instructions stored in the memory device 1404 and/or storage devices 1428 and processed by the processing unit 1402. Security and access control parameters, training fingerprint patterns, and other data may be stored in the memory device 1404 and/or storage devices 1428 as persistent datastores.

An example imaging system includes a cover glass having a display surface and a pixelated photoemitting element array. One or more selected photoemitting elements of the pixelated photoemitting element array are configured to emit a light signal through the cover glass to the display surface. The example imaging system also includes a pixelated photodetecting element array positioned relative to the pixelated photoemitting element array and the cover glass to receive a reflected light signal at individual photodetecting elements of the pixelated photodetecting element array. The reflected light signal includes a portion of the emitted light signal reflected by total internal reflection from a refractive boundary at the display surface of the cover glass.

Another example imaging system of any preceding system is configured such that the reflected light signal excludes a portion of the emitted light signal transmitted through the refractive boundary at the display surface.

Another example imaging system of any preceding system is configured such that the reflected light signal excludes a portion of the emitted light signal transmitted through the refractive boundary at the display surface. The transmitted portion of the emitted light signal has an angle of incidence with the display surface that is less than a critical angle of the refractive boundary at the display surface of the cover glass.

Another example imaging system of any preceding system is configured such that the reflected light signal includes a portion of the emitted light signal reflected by total internal reflection. The reflected portion of the emitted light signal has an angle of incidence with the display surface that is greater than a critical angle of the refractive boundary at the display surface of the cover glass.

Another example imaging system of any preceding system is configured such that the reflected light signal includes a feature-scattered portion of the emitted light signal resulting from total internal reflection from the refractive boundary at the display surface of the cover glass. The feature-scattered portion of the emitted light signal corresponds to a region of optical coupling at the refractive boundary at the display surface of the cover glass and an optically-coupled feature of an object on the display surface of the cover glass.

Another example imaging system of any preceding system is configured such that the reflected light signal includes a non-feature portion of the emitted light signal resulting from total internal reflection from the refractive boundary at the display surface of the covered glass. The non-feature portion of the emitted light signal corresponds to a region of the display surface of the cover glass in which a feature of an object is not optically coupled at the refractive boundary at the display surface of the cover glass.

Another example imaging system of any preceding system further includes imaging processing circuitry electronically connected to the pixelated photodetecting element array and configured to stitch the reflected light signal received by each photodetecting element of the pixelated photodetecting element array into a composite image of an object in contact with the display surface of the display.

Another example imaging system of any preceding system further includes imaging processing circuitry electronically connected to the pixelated photoemitting element array and the pixelated photodetecting element array and configured to scan emitted light from an area of the pixelated photoemitting element array and to capture by the pixelated photodetecting element array the scanned emitted light as the reflected light signal as the scanned emitted light reflects from the refractive boundary at the display surface of the cover glass.

An example method includes emitting a light signal through a cover glass of a display to a display surface of the display. The light signal is emitted from one or more selected photoemitting elements of a pixelated photoemitting element array of the display. The method further includes capturing a reflected light signal at individual photodetecting elements of a pixelated photodetecting element array positioned relative to the pixelated photoemitting element array and the cover glass to receive the reflected light signal. The reflected light signal includes a portion of the emitted light signal reflected by total internal reflection from a refractive boundary at the display surface of the cover glass.

Another example method of any preceding method is operated such that the reflected light signal excludes a portion of the emitted light signal transmitted through the refractive boundary at the display surface.

Another example method of any preceding method is operated such that the reflected light signal excludes a portion of the emitted light signal transmitted through the refractive boundary at the display surface. The transmitted portion of the emitted light signal has an angle of incidence with the display surface that is less than a critical angle of the refractive boundary at the display surface of the cover glass.

Another example method of any preceding method is operated such that the reflected light signal includes a portion of the emitted light signal reflected by total internal reflection. The reflected portion of the emitted light signal has an angle of incidence with the display surface that is greater than a critical angle of the refractive boundary at the display surface of the cover glass.

Another example method of any preceding method is operated such that the reflected light signal includes a feature-scattered portion of the emitted light signal resulting from total internal reflection from the refractive boundary at the display surface of the covered glass, the feature-scattered portion of the emitted light signal corresponding to a region of optical coupling at the refractive boundary at the display surface of the cover glass and an optically-coupled feature of an object on the display surface of the cover glass.

Another example method of any preceding method is operated such that the reflected light signal includes a non-feature portion of the emitted light signal resulting from total internal reflection from the refractive boundary at the display surface of the covered glass, the non-feature portion of the emitted light signal corresponding to a region of the display surface of the cover glass in which a feature of an object is not optically coupled at the refractive boundary at the display surface of the cover glass.

Another example method of any preceding method further including stitching the captured reflected light signal received by each photodetecting element of the photodetecting element array into a composite image of an object in contact with the display surface of the display.

Another example method of any preceding method further including scanning emitted light from an area of the pixelated photoemitting element array and to capture by the pixelated photodetecting element array the scanned emitted light as the reflected light signal as the scanned emitted light reflects from the refractive boundary at the display surface of the cover glass.

An example electronic device includes a cover glass having a display surface and a pixelated photoemitting element array. One or more selected photoemitting elements of the pixelated photoemitting element array are configured to emit a light signal through the cover glass to the display surface. The example electronic device also includes a pixelated photodetecting element array positioned relative to the pixelated photoemitting element array and the cover glass to receive a reflected light signal at individual photodetecting elements of the pixelated photodetecting element array. The reflected light signal includes a portion of the emitted light signal reflected by total internal reflection from a refractive boundary at the display surface of the cover glass. The example electronic device also includes image processing circuitry electrically coupled to the pixelated photoemitting element array and the pixelated photoemitting element array and configured to stitch the reflected light signal received by each photodetecting element of the pixelated photodetecting element array into a composite image of an object in contact with the display surface of the display.

Another example electronic device of any preceding device is configured such that the reflected light signal excludes a portion of the emitted light signal transmitted through the refractive boundary at the display surface. The transmitted portion of the emitted light signal has an angle of incidence with the display surface that is less than a critical angle of the refractive boundary at the display surface of the cover glass.

Another example electronic device of any preceding device is configured such that the reflected light signal includes a feature-scattered portion of the emitted light signal resulting from total internal reflection from the refractive boundary at the display surface of the cover glass. The feature-scattered portion of the emitted light signal corresponds to a region of optical coupling at the refractive boundary at the display surface of the cover glass and an optically-coupled feature of an object on the display surface of the cover glass.

Another example electronic device of any preceding device is configured such that the reflected light signal includes a non-feature portion of the emitted light signal resulting from total internal reflection from the refractive boundary at the display surface of the covered glass. The non-feature portion of the emitted light signal corresponds to a region of the display surface of the cover glass in which a feature of an object is not optically coupled at the refractive boundary at the display surface of the cover glass.

An example system includes means for emitting a light signal through a cover glass of a display to a display surface of the display. The light signal is emitted from one or more selected photoemitting elements of a pixelated photoemitting element array of the display. The method further includes means for capturing a reflected light signal at individual photodetecting elements of a pixelated photodetecting element array positioned relative to the pixelated photoemitting element array and the cover glass to receive the reflected light signal. The reflected light signal includes a portion of the emitted light signal reflected by total internal reflection from a refractive boundary at the display surface of the cover glass.

Another example system of any preceding system is configured such that the reflected light signal excludes a portion of the emitted light signal transmitted through the refractive boundary at the display surface.

Another example system of any preceding system is configured such that the reflected light signal excludes a portion of the emitted light signal transmitted through the refractive boundary at the display surface. The transmitted portion of the emitted light signal has an angle of incidence with the display surface that is less than a critical angle of the refractive boundary at the display surface of the cover glass.

Another example system of any preceding system is configured such that the reflected light signal includes a portion of the emitted light signal reflected by total internal reflection. The reflected portion of the emitted light signal has an angle of incidence with the display surface that is greater than a critical angle of the refractive boundary at the display surface of the cover glass.

Another example system of any preceding system is configured such that the reflected light signal includes a feature-scattered portion of the emitted light signal resulting from total internal reflection from the refractive boundary at the display surface of the covered glass, the feature-scattered portion of the emitted light signal corresponding to a region of optical coupling at the refractive boundary at the display surface of the cover glass and an optically-coupled feature of an object on the display surface of the cover glass.

Another example system of any preceding system is configured such that the reflected light signal includes a non-feature portion of the emitted light signal resulting from total internal reflection from the refractive boundary at the display surface of the covered glass, the non-feature portion of the emitted light signal corresponding to a region of the display surface of the cover glass in which a feature of an object is not optically coupled at the refractive boundary at the display surface of the cover glass.

Another example system of any preceding system further includes means for stitching the captured reflected light signal received by each photodetecting element of the photodetecting element array into a composite image of an object in contact with the display surface of the display.

Another example system of any preceding system further includes means for scanning emitted light from an area of the pixelated photoemitting element array and to capture by the pixelated photodetecting element array the scanned emitted light as the reflected light signal as the scanned emitted light reflects from the refractive boundary at the display surface of the cover glass.

Another example imaging system includes a pixel selector signal bus configured to communicate a pixel selection signal component and a pixel array of a display. The pixel array is electrically connected to the pixel selector signal bus and includes multiple pixels configured to sense an image of an object in contact with a surface of the display. Each pixel in the pixel array includes one or more photodetecting elements and one or more photoemitting elements. Operation of each pixel is switched between the one or more photodetecting elements and the one or more photoemitting elements by the pixel selector signal component received from the pixel selector signal bus.

Another example imaging system of any preceding system is configured such that the one or more photodetectors and the one or more photoemitting elements are positioned within the display.

Another example imaging system of any preceding system is configured such that the one or more photodetectors and the one or more photoemitting elements are bonded to the display opposite a display surface of a cover glass of the display.

Another example imaging system of any preceding system is configured such that the one or more photodetecting elements are bonded to the display opposite a display surface of a cover glass of the display and the one or more photoemitting elements are positioned within the display.

Another example imaging system of any preceding system is configured such that the one or more photodetecting elements are positioned within the display and the one or more photoemitting elements are bonded to the display opposite a display surface of a cover glass of the display.

Another example imaging system of any preceding system is configured such that the polarity of the pixel selector signal component received from the pixel selector signal bus selects photoemitter driver electronics to turn on the one or more photoemitting elements in the pixel.

Another example imaging system of any preceding system is configured such that the polarity of the pixel selector signal component received from the pixel selector signal bus selects photodetector driver electronics to turn on the one or more photodetecting elements in the pixel.

Another example imaging system of any preceding system is configured such that the pixel selector signal bus communicates an output data signal component from the pixel when the photodetector driver electronics has turned on the one or more photodetecting elements in the pixel.

Another example method includes communicating a pixel selection signal component on a pixel selector signal bus and switching operation of each pixel of a pixel array in a display between a photoemitting operation and a photodetecting operation by the pixel selector signal component received from the pixel selector signal bus. Each pixel in the pixel array includes one or more photodetectors and one or more photoemitting elements. The pixel array is electrically connected to the pixel selector signal bus and includes multiple pixels configured to sense an image of an object in contact with a surface of the display.

Another example method of any preceding method is operated such that the one or more photodetectors and the one or more photoemitting elements are positioned within the display.

Another example method of any preceding method is operated such that the one or more photodetectors and the one or more photoemitting elements are bonded to the display opposite a display surface of a cover glass of the display.

Another example method of any preceding method is operated such that the one or more photodetecting elements are bonded to the display opposite a display surface of a cover glass of the display and the one or more photoemitting elements are positioned within the display.

Another example method of any preceding method is operated such that the one or more photodetecting elements are positioned within the display and the one or more photoemitting elements are bonded to the display opposite a display surface of a cover glass of the display.

Another example method of any preceding method is operated such that the polarity of the pixel selector signal component received from the pixel selector signal bus selects photoemitter driver electronics to turn on the one or more photoemitting elements in the pixel.

Another example method of any preceding method is operated such that the polarity of the pixel selector signal component received from the pixel selector signal bus selects photodetector driver electronics to turn on the one or more photodetecting elements in the pixel.

Another example method of any preceding method is operated such that the pixel selector signal bus communicates an output data signal component from the pixel when the photodetector driver electronics has turned on the one or more photodetecting elements in the pixel.

Another example electronic device includes a cover glass of a display having a display surface and a pixel selector signal bus configured to communicate a pixel selection signal component. The example electronic device also includes a pixel array of the display. The pixel array is electrically connected to the pixel selector signal bus and includes multiple pixels configured to sense an image of an object in contact with a surface of the display. Each pixel in the pixel array includes one or more photodetecting elements and one or more photoemitting elements. Operation of each pixel is switched between the one or more photodetecting elements and the one or more photoemitting elements by the pixel selector signal component received from the pixel selector signal bus. The example electronic device also includes image processing circuitry electrically coupled to the pixel array and configured to scan light from multiple pixels of the pixel array and stitch a light signal reflected from a refractive boundary at the display surface and received by photodetecting elements of the pixelated photodetecting element array into a composite image of the object.

Another example electronic device of any preceding device is configured such that the one or more photodetectors and the one or more photoemitting elements are positioned within the display.

Another example electronic device of any preceding device is configured such that the one or more photodetecting elements and the one or more photoemitting elements are positioned on different layers within the display.

Another example electronic device of any preceding device is configured such that the polarity of the pixel selector signal component received from the pixel selector signal bus alternatively selects photoemitter driver electronics to turn on the one or more photoemitting elements in the pixel and selects photodetector driver electronics to turn on the one or more photodetecting elements in the pixel.

Another example system includes means for communicating a pixel selection signal component on a pixel selector signal bus and means for switching operation of each pixel of a pixel array in a display between a photoemitting operation and a photodetecting operation by the pixel selector signal component received from the pixel selector signal bus. Each pixel in the pixel array includes one or more photodetectors and one or more photoemitting elements. The pixel array is electrically connected to the pixel selector signal bus and includes multiple pixels configured to sense an image of an object in contact with a surface of the display.

Another example system of any preceding system is configured such that the one or more photodetectors and the one or more photoemitting elements are positioned within the display.

Another example system of any preceding system is configured such that the one or more photodetectors and the one or more photoemitting elements are bonded to the display opposite a display surface of a cover glass of the display.

Another example system of any preceding system is configured such that the one or more photodetecting elements are bonded to the display opposite a display surface of a cover glass of the display and the one or more photoemitting elements are positioned within the display.

Another example system of any preceding system is configured such that the one or more photodetecting elements are positioned within the display and the one or more photoemitting elements are bonded to the display opposite a display surface of a cover glass of the display.

Another example system of any preceding system is configured such that the polarity of the pixel selector signal component received from the pixel selector signal bus selects photoemitter driver electronics to turn on the one or more photoemitting elements in the pixel.

Another example system of any preceding system is configured such that the polarity of the pixel selector signal component received from the pixel selector signal bus selects photodetector driver electronics to turn on the one or more photodetecting elements in the pixel.

Another example system of any preceding system is configured such that the pixel selector signal bus communicates an output data signal component from the pixel when the photodetector driver electronics has turned on the one or more photodetecting elements in the pixel.

Another example imaging system includes a cover glass having a display surface and a pixelated photoemitting element array. One or more selected photoemitting elements of the pixelated photoemitting element array is configured to emit a light signal through the cover glass to the display surface as part of an imaging scan. The example imaging system also includes a pixelated photodetecting element array positioned relative to the pixelated photoemitting element array and the cover glass to receive a reflected light signal at individual photodetecting elements of the pixelated photodetecting element array as part of the imaging scan. The example imaging system also includes a sensing trigger configured to trigger the imaging scan by the pixelated photoemitting element array and the pixelated photodetecting element array, responsive to detection of an initiating action by the sensing trigger.

Another example imaging system of any preceding system is configured such that the sensing trigger includes a pressure sensor.

Another example imaging system of any preceding system is configured such the sensing trigger includes a capacitive sensor.

Another example imaging system of any preceding system is configured such the sensing trigger includes a resistive sensor.

Another example imaging system of any preceding system is configured such the reflected light signal received at individual photodetecting elements of the pixelated photodetecting element array is reflected from a refractive boundary at the display surface of the cover glass by total internal reflection.

Another example imaging system of any preceding system further includes image processing circuitry coupled to the sensing trigger, the pixelated photoemitting element array and the pixelated photodetecting element array. The sensing trigger transmits trigger data to image processing circuitry to initiate an imaging scan through the cover glass.

Another example imaging system of any preceding system further includes image processing circuitry coupled to the sensing trigger, the pixelated photoemitting element array and the pixelated photodetecting element array. The sensing trigger transmits location information in the trigger data to the image processing circuitry to localize the imaging scan through the cover glass.

Another example method includes emitting a light signal through a cover glass of a display to a display surface of the display. The light signal is emitted from one or more selected photoemitting elements of a pixelated photoemitting element array of the display as part of an imaging scan. The example method also includes capturing a reflected light signal at individual photodetecting elements of a pixelated photodetecting element array positioned relative to a pixelated photoemitting element array and the cover glass to receive the reflected light signal as part of the imaging scan. The example method also includes triggering the imaging scan by the pixelated photoemitting element array and the pixelated photodetecting element array, responsive to detection of an initiating action by a sensing trigger positioned relative to the pixelated photodetecting element array.

Another example method of any preceding method is operated such that the sensing trigger includes a pressure sensor.

Another example method of any preceding method is operated such that the sensing trigger includes a capacitive sensor.

Another example method of any preceding method is operated such that the sensing trigger includes a resistive sensor.

Another example method of any preceding method is operated such that the reflected light signal received at individual photodetecting elements of the pixelated photodetecting element array is reflected from a refractive boundary at the display surface of the cover glass by total internal reflection.

Another example method of any preceding method further includes initiating the imaging scan through the cover glass responsive to receipt of triggering data transmitted by the imaging sensor and received by image processing circuitry.

Another example method of any preceding method further includes localizing the imaging scan through the cover glass responsive to receipt of location information in the trigger data transmitted by the imaging sensor and received by the image processing circuitry.

Another example electronic device includes a cover glass having a display surface and a pixelated photoemitting element array. One or more selected photoemitting elements of the pixelated photoemitting element array is configured to emit a light signal through the cover glass to the display surface as part of an imaging scan. The example electronic device also includes a pixelated photodetecting element array positioned relative to the pixelated photoemitting element array and the cover glass to receive a reflected light signal at individual photodetecting elements of the pixelated photodetecting element array as part of the imaging scan. The electronic device also includes a sensing trigger configured to trigger the imaging scan by the pixelated photoemitting element array and the pixelated photodetecting element array, responsive to detection of an initiating action by the sensing trigger. The example electronic device also includes image processing circuitry coupled to the sensing trigger, the pixelated photoemitting element array and the pixelated photodetecting element array. The sensing trigger transmits trigger data to image processing circuitry to initiate the imaging scan through the cover glass.

Another example electronic device of any preceding device is configured such that the sensing trigger includes a pressure sensor.

Another example electronic device of any preceding device is configured such that the sensing trigger includes a capacitive sensor.

Another example electronic device of any preceding device is configured such that the sensing trigger includes a resistive sensor.

Another example electronic device of any preceding device is configured such that the reflected light signal received at individual photodetecting elements of the pixelated photodetecting element array is reflected from a refractive boundary at the display surface of the cover glass by total internal reflection.

Another example electronic device of any preceding device is configured such that the image processing circuitry is coupled to the sensing trigger, the pixelated photoemitting element array and the pixelated photodetecting element array. The sensing trigger transmits location information in the trigger data to the image processing circuitry to localize the imaging scan through the cover glass.

Another example system includes means for emitting a light signal through a cover glass of a display to a display surface of the display. The light signal is emitted from one or more selected photoemitting elements of a pixelated photoemitting element array of the display as part of an imaging scan. The example system also includes means for capturing a reflected light signal at individual photodetecting elements of a pixelated photodetecting element array positioned relative to a pixelated photoemitting element array and the cover glass to receive the reflected light signal as part of the imaging scan. The example system also includes means for triggering the imaging scan by the pixelated photoemitting element array and the pixelated photodetecting element array, responsive to detection of an initiating action by a sensing trigger positioned relative to the pixelated photodetecting element array.

Another example system of any preceding system is configured such that the sensing trigger includes a pressure sensor.

Another example system of any preceding system is configured such that the sensing trigger includes a capacitive sensor.

Another example system of any preceding system is configured such that the sensing trigger includes a resistive sensor.

Another example system of any preceding system is configured such that the reflected light signal received at individual photodetecting elements of the pixelated photodetecting element array is reflected from a refractive boundary at the display surface of the cover glass by total internal reflection.

Another example system of any preceding system further includes means for initiating the imaging scan through the cover glass responsive to receipt of triggering data transmitted by the imaging sensor and received by image processing circuitry.

Another example system of any preceding system further includes means for localizing the imaging scan through the cover glass responsive to receipt of location information in the trigger data transmitted by the imaging sensor and received by the image processing circuitry.

The processing system 1400 may include a variety of tangible computer-readable storage media and intangible computer-readable communication signals. Tangible computer-readable storage can be embodied by any available media that can be accessed by the processing system 1400 and includes both volatile and nonvolatile storage media, removable and non-removable storage media. Tangible computer-readable storage media excludes intangible communications signals and includes volatile and nonvolatile, removable and non-removable storage media implemented in any method or technology for storage of information such as computer readable instructions, data structures, program modules or other data. Tangible computer-readable storage media includes, but is not limited to, RAM, ROM, EEPROM, flash memory or other memory technology, CDROM, digital versatile disks (DVD) or other optical disk storage, magnetic cassettes, magnetic tape, magnetic disk storage or other magnetic storage devices, or any other tangible medium which can be used to store the desired information and which can be accessed by the processing system 1400. In contrast to tangible computer-readable storage media, intangible computer-readable communication signals may embody computer readable instructions, data structures, program modules or other data resident in a modulated data signal, such as a carrier wave or other signal transport mechanism. The term "modulated data signal" means a signal that has one or more of its characteristics set or changed in such a manner as to encode information in the signal. By way of example, and not limitation, intangible communication signals include signals traveling through wired media such as a wired network or direct-wired connection, and wireless media such as acoustic, RF, infrared and other wireless media.

Some embodiments may comprise an article of manufacture. An article of manufacture may comprise a tangible storage medium to store logic. Examples of a storage medium may include one or more types of computer-readable storage media capable of storing electronic data, including volatile memory or non-volatile memory, removable or non-removable memory, erasable or non-erasable memory, writeable or re-writeable memory, and so forth. Examples of the logic may include various software elements, such as software components, programs, applications, computer programs, application programs, system programs, machine programs, operating system software, middleware, firmware, software modules, routines, subroutines, operation segments, methods, procedures, software interfaces, application program interfaces (API), instruction sets, computing code, computer code, code segments, computer code segments, words, values, symbols, or any combination thereof. In one embodiment, for example, an article of manufacture may store executable computer program instructions that, when executed by a computer, cause the computer to perform methods and/or operations in accordance with the described embodiments. The executable computer program instructions may include any suitable type of code, such as source code, compiled code, interpreted code, executable code, static code, dynamic code, and the like. The executable computer program instructions may be implemented according to a predefined computer language, manner or syntax, for instructing a computer to perform a certain operation segment. The instructions may be implemented using any suitable high-level, low-level, object-oriented, visual, compiled and/or interpreted programming language.

The implementations described herein are implemented as logical steps in one or more computer systems. The logical operations may be implemented (1) as a sequence of processor-implemented steps executing in one or more computer systems and (2) as interconnected machine or circuit modules within one or more computer systems. The implementation is a matter of choice, dependent on the performance requirements of the computer system being utilized. Accordingly, the logical operations making up the implementations described herein are referred to variously as operations, steps, objects, or modules. Furthermore, it should be understood that logical operations may be performed in any order, unless explicitly claimed otherwise or a specific order is inherently necessitated by the claim language.

What is claimed is:

1. An imaging system comprising:
   a cover glass having a display surface;
   a pixelated photoemitting element array, one or more selected photoemitting elements of the pixelated photoemitting element array being configured to emit a light signal through the cover glass to the display surface; and
   a pixelated photodetecting element array positioned relative to the pixelated photoemitting element array and the cover glass to receive a reflected light signal at individual photodetecting elements of the pixelated photodetecting element array, the reflected light signal including a portion of the emitted light signal reflected by total internal reflection from a refractive boundary at the display surface of the cover glass; and
   wherein the reflected light signal includes a non-feature portion of the emitted light signal resulting from total internal reflection from the refractive boundary at the display surface of the covered glass.

2. The imaging system of claim 1 wherein the reflected light signal excludes a portion of the emitted light signal transmitted through the refractive boundary at the display surface.

3. The imaging system of claim 1 wherein the reflected light signal excludes a portion of the emitted light signal transmitted through the refractive boundary at the display surface, the transmitted portion of the emitted light signal having an angle of incidence with the display surface that is less than a critical angle of the refractive boundary at the display surface of the cover glass.

4. The imaging system of claim 1 wherein the reflected light signal includes a portion of the emitted light signal reflected by total internal reflection, the reflected portion of the emitted light signal having an angle of incidence with the display surface that is greater than a critical angle of the refractive boundary at the display surface of the cover glass.

5. The imaging system of claim 1 wherein the reflected light signal includes a feature-scattered portion of the emitted light signal resulting from total internal reflection from the refractive boundary at the display surface of the cover glass, the feature-scattered portion of the emitted light signal corresponding to a region of optical coupling at the refractive boundary at the display surface of the cover glass and an optically-coupled feature of an object on the display surface of the cover glass.

6. The imaging system of claim 1, wherein the non-feature portion of the emitted light signal corresponding to a region of the display surface of the cover glass in which a feature of an object is not optically coupled at the refractive boundary at the display surface of the cover glass.

7. The imaging system of claim 1 further comprising:
   imaging processing circuitry electronically connected to the pixelated photodetecting element array and configured to stitch the reflected light signal received by each photodetecting element of the pixelated photodetecting element array into a composite image of an object in contact with the display surface of the display.

8. The imaging system of claim 1 further comprising:
   imaging processing circuitry electronically connected to the pixelated photoemitting element array and the pixelated photodetecting element array and configured to scan emitted light from an area of the pixelated photoemitting element array and to capture by the pixelated photodetecting element array the scanned emitted light as the reflected light signal as the scanned emitted light reflects from the refractive boundary at the display surface of the cover glass.

9. The imaging system of claim 1, wherein the pixelated photoemitting element array includes pixelated elements photoemitting element array includes pixelated elements that are also light-emitting elements of the display surface.

10. The imaging system of claim 1, wherein the reflected light signal passes through at least a portion of the display surface prior to arriving at the pixelated photodetecting element array.

11. A method comprising:
    emitting a light signal through a cover glass of a display to a display surface of the display, the light signal being emitted from one or more selected photoemitting elements of a pixelated photoemitting element array of the display; and
    capturing a reflected light signal at individual photodetecting elements of a pixelated photodetecting element array positioned relative to the pixelated photoemitting element array and the cover glass to receive the reflected light signal, the reflected light signal including a portion of the emitted light signal reflected by total internal reflection from a refractive boundary at the display surface of the cover glass; and
    wherein the reflected light signal includes a non-feature portion of the emitted light signal resulting from total internal reflection from the refractive boundary at the display surface of the covered glass.

12. The method of claim 11 wherein the reflected light signal excludes a portion of the emitted light signal transmitted through the refractive boundary at the display surface.

13. The method of claim 11 wherein the reflected light signal excludes a portion of the emitted light signal transmitted through the refractive boundary at the display surface, the transmitted portion of the emitted light signal having an angle of incidence with the display surface that is less than a critical angle of the refractive boundary at the display surface of the cover glass.

14. The method of claim 11 wherein the reflected light signal includes a portion of the emitted light signal reflected by total internal reflection, the reflected portion of the emitted light signal having an angle of incidence with the display surface that is greater than a critical angle of the refractive boundary at the display surface of the cover glass.

15. The method of claim 11 wherein the reflected light signal includes a feature-scattered portion of the emitted light signal resulting from total internal reflection from the refractive boundary at the display surface of the covered glass, the feature-scattered portion of the emitted light signal corresponding to a region of optical coupling at the refractive boundary at the display surface of the cover glass and an optically-coupled feature of an object on the display surface of the cover glass.

16. The method of claim 11 wherein, the non-feature portion of the emitted light signal corresponding to a region of the display surface of the cover glass in which a feature of an object is not optically coupled at the refractive boundary at the display surface of the cover glass.

17. The method of claim 11 further comprising:
stitching the captured reflected light signal received by each photodetecting element of the photodetecting element array into a composite image of an object in contact with the display surface of the display.

18. The method of claim 11 further comprising:
scanning emitted light from an area of the pixelated photoemitting element array and to capture by the pixelated photodetecting element array the scanned emitted light as the reflected light signal as the scanned emitted light reflects from the refractive boundary at the display surface of the cover glass.

19. An electronic device comprising:
a cover glass having a display surface;
a pixelated photoemitting element array, one or more selected photoemitting elements of the pixelated photoemitting element array being configured to emit a light signal through the cover glass to the display surface;
a pixelated photodetecting element array positioned relative to the pixelated photoemitting element array and the cover glass to receive a reflected light signal at individual photodetecting elements of the pixelated photodetecting element array, the reflected light signal including a portion of the emitted light signal reflected by total internal reflection from a refractive boundary at the display surface of the cover glass; and
image processing circuitry electrically coupled to the pixelated photoemitting element array and the pixelated photodetecting element array and configured to stitch the reflected light signal received by each photodetecting element of the pixelated photodetecting element array into a composite image of an object in contact with the display surface of the display; and
wherein the reflected light signal includes a non-feature portion of the emitted light signal resulting from total internal reflection from the refractive boundary at the display surface of the covered glass.

20. The electronic device of claim 19 wherein the reflected light signal excludes a portion of the emitted light signal transmitted through the refractive boundary at the display surface, the transmitted portion of the emitted light signal having an angle of incidence with the display surface that is less than a critical angle of the refractive boundary at the display surface of the cover glass.

21. The electronic device of claim 19 wherein the reflected light signal includes a feature-scattered portion of the emitted light signal resulting from total internal reflection from the refractive boundary at the display surface of the cover glass, the feature-scattered portion of the emitted light signal corresponding to a region of optical coupling at the refractive boundary at the display surface of the cover glass and an optically-coupled feature of an object on the display surface of the cover glass.

22. The electronic device of claim 19 wherein, the non-feature portion of the emitted light signal corresponding to a region of the display surface of the cover glass in which a feature of an object is not optically coupled at the refractive boundary at the display surface of the cover glass.

* * * * *